(12) United States Patent
Yamazaki et al.

(10) Patent No.: US 7,560,860 B2
(45) Date of Patent: *Jul. 14, 2009

(54) LIGHT EMITTING DEVICE INCLUDING MULTIPLE LIGHT EMITTING LAYERS

(75) Inventors: Shunpei Yamazaki, Tokyo (JP); Jun Koyama, Kanagawa (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 814 days.

This patent is subject to a terminal disclaimer.

(21) Appl. No.: 10/972,322

(22) Filed: Oct. 26, 2004

(65) Prior Publication Data

US 2005/0082970 A1  Apr. 21, 2005

Related U.S. Application Data

(63) Continuation of application No. 09/931,050, filed on Aug. 17, 2001, now Pat. No. 6,822,629.

(30) Foreign Application Priority Data

Aug. 18, 2000  (JP) .............................. 2000-248912

(51) Int. Cl.
*H01J 1/62* (2006.01)
(52) U.S. Cl. ....................... 313/504; 313/506
(58) Field of Classification Search ................. 313/504, 313/536
See application file for complete search history.

(56) References Cited

U.S. PATENT DOCUMENTS

| | | | |
|---|---|---|---|
| 5,294,870 A * | 3/1994 | Tang et al. .................. | 313/504 |
| 5,670,792 A | 9/1997 | Utsugi et al. | |
| 6,147,451 A | 11/2000 | Shibata et al. | |
| 6,219,021 B1 | 4/2001 | Izumi | |
| 6,246,179 B1 * | 6/2001 | Yamada ...................... | 313/498 |
| 6,384,529 B2 | 5/2002 | Tang et al. | |

(Continued)

FOREIGN PATENT DOCUMENTS

EP  1 058 311 A2  12/2000

(Continued)

OTHER PUBLICATIONS

Baldo et al.; "Highly Efficient Phosphorescent Emission from Organic Electroluminescent Devices"; *Nature*, vol. 395; pp. 151-154; Sep. 10, 1998.

(Continued)

*Primary Examiner*—Peter Macchiarolo
(74) *Attorney, Agent, or Firm*—Fish & Richardson P.C.

(57) ABSTRACT

There is provided an active matrix type light emitting device which can be easily made multicolored. In a pixel portion of the light emitting device, a plurality of light emitting layers shared by a plurality of pixels are formed, so that a display of a plurality of colors becomes possible. Further, a preliminary region is provided in a region interposed between different light emitting layers, so that poor quality can be prevented from being produced due to a mask shift or the like at the time of formation of the light emitting layers. Further, a light emitting layer made of a triplet compound is used so that reduction in electric power can be realized.

41 Claims, 15 Drawing Sheets

U.S. PATENT DOCUMENTS

| | | | |
|---|---|---|---|
| 6,689,492 B1 | 2/2004 | Yamazaki et al. | |
| 6,791,129 B2 | 9/2004 | Inukai | |
| 7,135,818 B2 * | 11/2006 | Min | 313/582 |
| 7,411,215 B2 * | 8/2008 | Hayakawa et al. | 257/72 |
| 7,449,351 B2 * | 11/2008 | Yamada | 438/29 |
| 2002/0047120 A1 | 4/2002 | Inukai | |
| 2003/0196597 A1 | 10/2003 | Yamazaki et al. | |
| 2005/0029916 A1 * | 2/2005 | Moon | 313/311 |
| 2005/0073241 A1 | 4/2005 | Yamauchi et al. | |
| 2005/0073242 A1 | 4/2005 | Yamauchi et al. | |
| 2005/0073264 A1 * | 4/2005 | Matsumoto | 313/497 |
| 2007/0090751 A1 * | 4/2007 | Cok et al. | 313/501 |

FOREIGN PATENT DOCUMENTS

| | | |
|---|---|---|
| EP | 1 058 484 A1 | 12/2000 |
| EP | 1 093 166 A2 | 4/2001 |
| EP | 1 093 167 A2 | 4/2001 |
| EP | 1 103 946 A2 | 5/2001 |
| EP | 1 150 273 A2 | 10/2001 |
| JP | 10-012377 | 1/1998 |
| JP | 11-087063 | 3/1999 |
| JP | 2000-123975 | 4/2000 |
| JP | 2000-227771 | 8/2000 |

OTHER PUBLICATIONS

Baldo et al.; "Very High-Efficiency Green Organic Light-Emitting Devices Based on Electrophosphorescence"; *Applied Physics Letters*; vol. 75(1); pp. 4-6; Jul. 5, 1999.

Tsutsui et al.; "Electroluminescence in Organic Thin Films"; *Photochemical Processes in Organized Molecular Systems*; pp. 437-450; 1991.

Tsutsui et al.; "High Quantum Efficiency in Organic Light-Emitting Device with Iridium-Complex as a Triplet Emissive Center"; *Japanese Journal of Applied Physics*, vol. 38, Part 12B; pp. L1502-L1504; Dec. 15, 1999.

Inukai; U.S. Appl. No. 09/724,387, filed on Nov. 28, 2000.

* cited by examiner

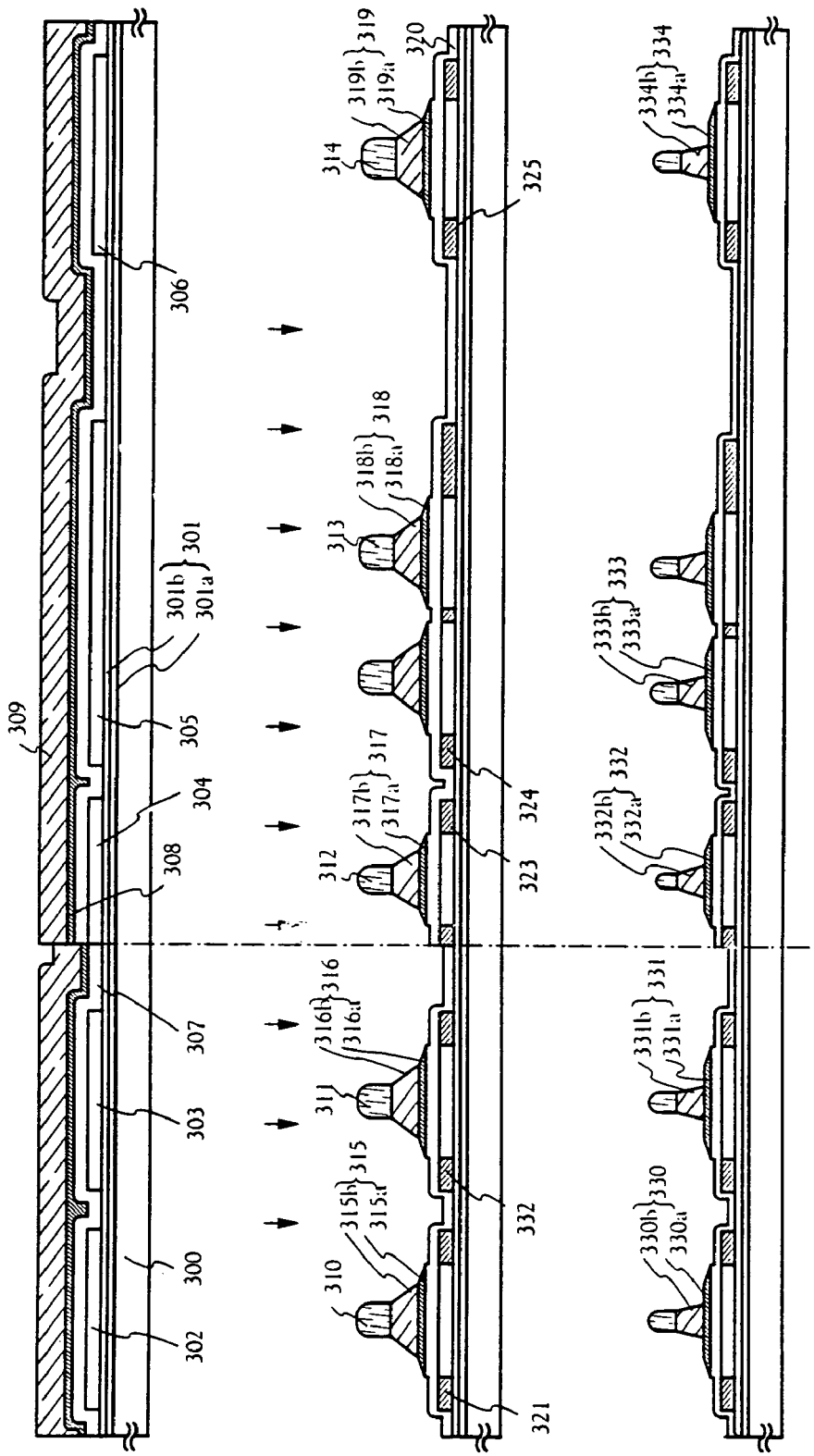

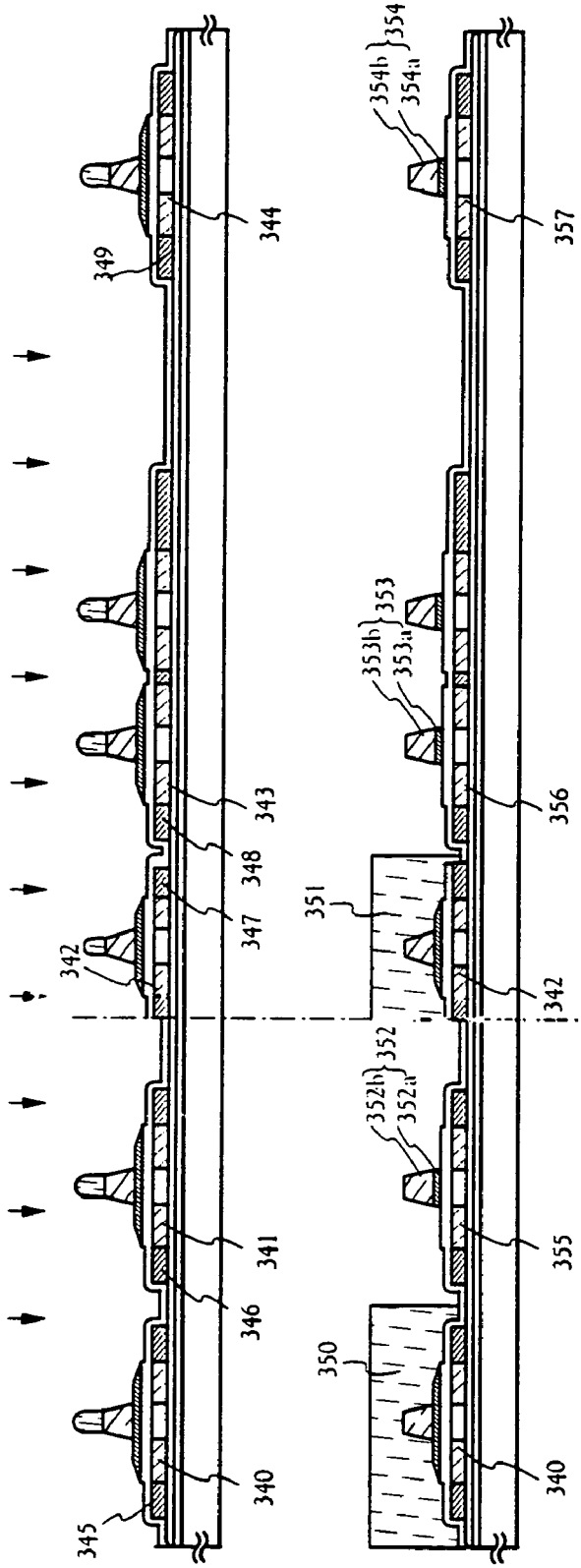
FIG. 4A
FIG. 4B
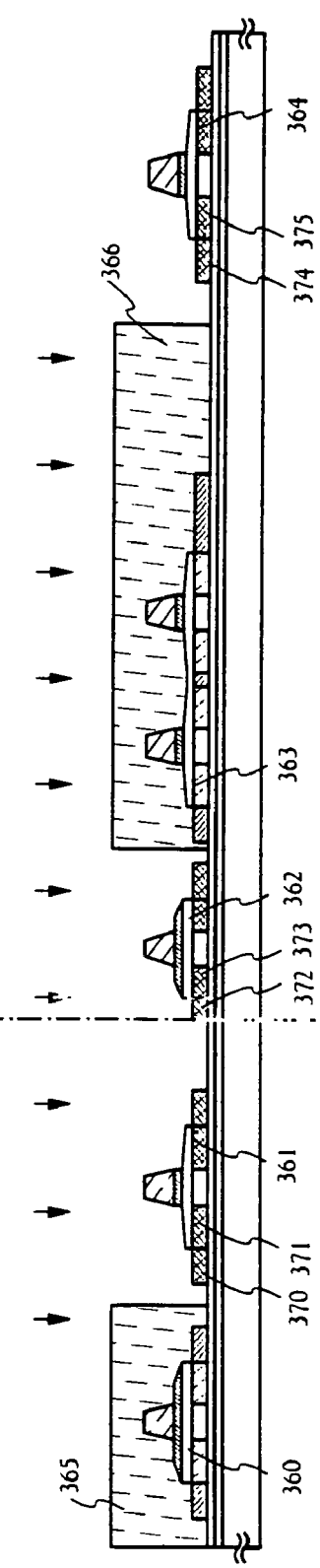
FIG. 4C

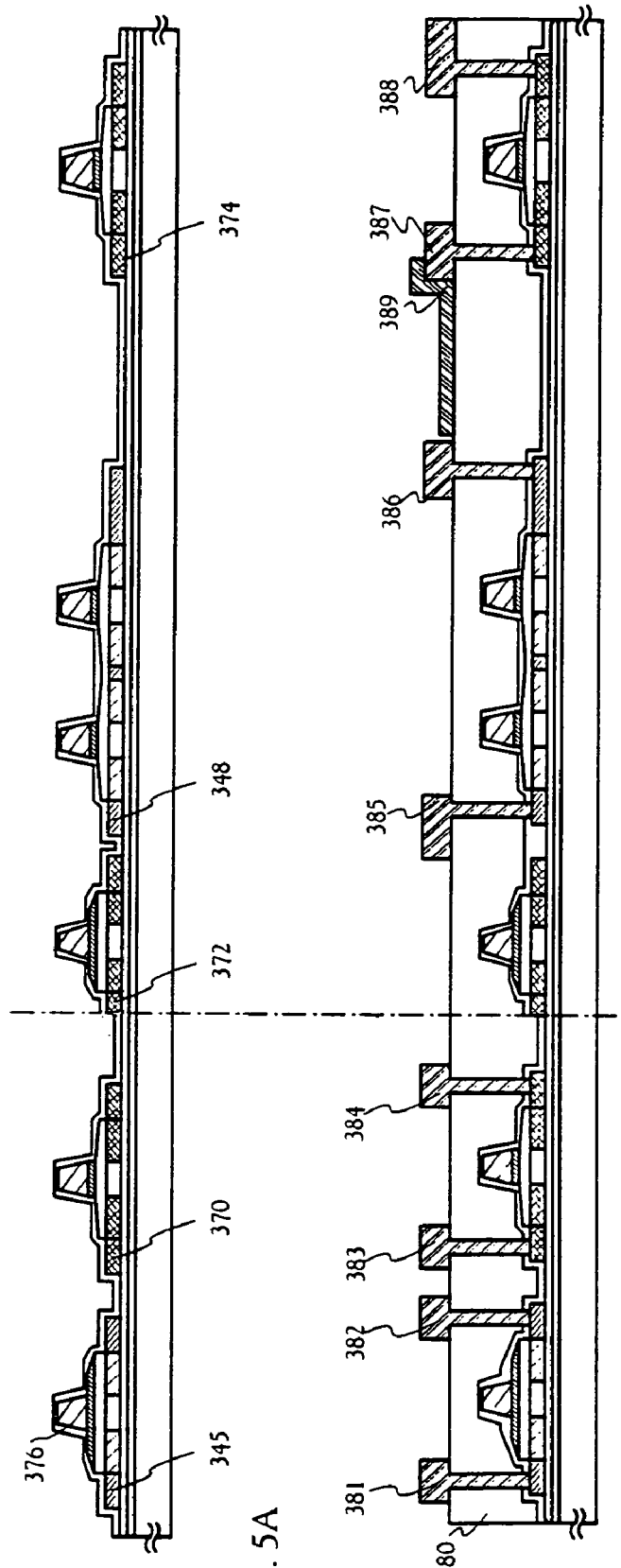

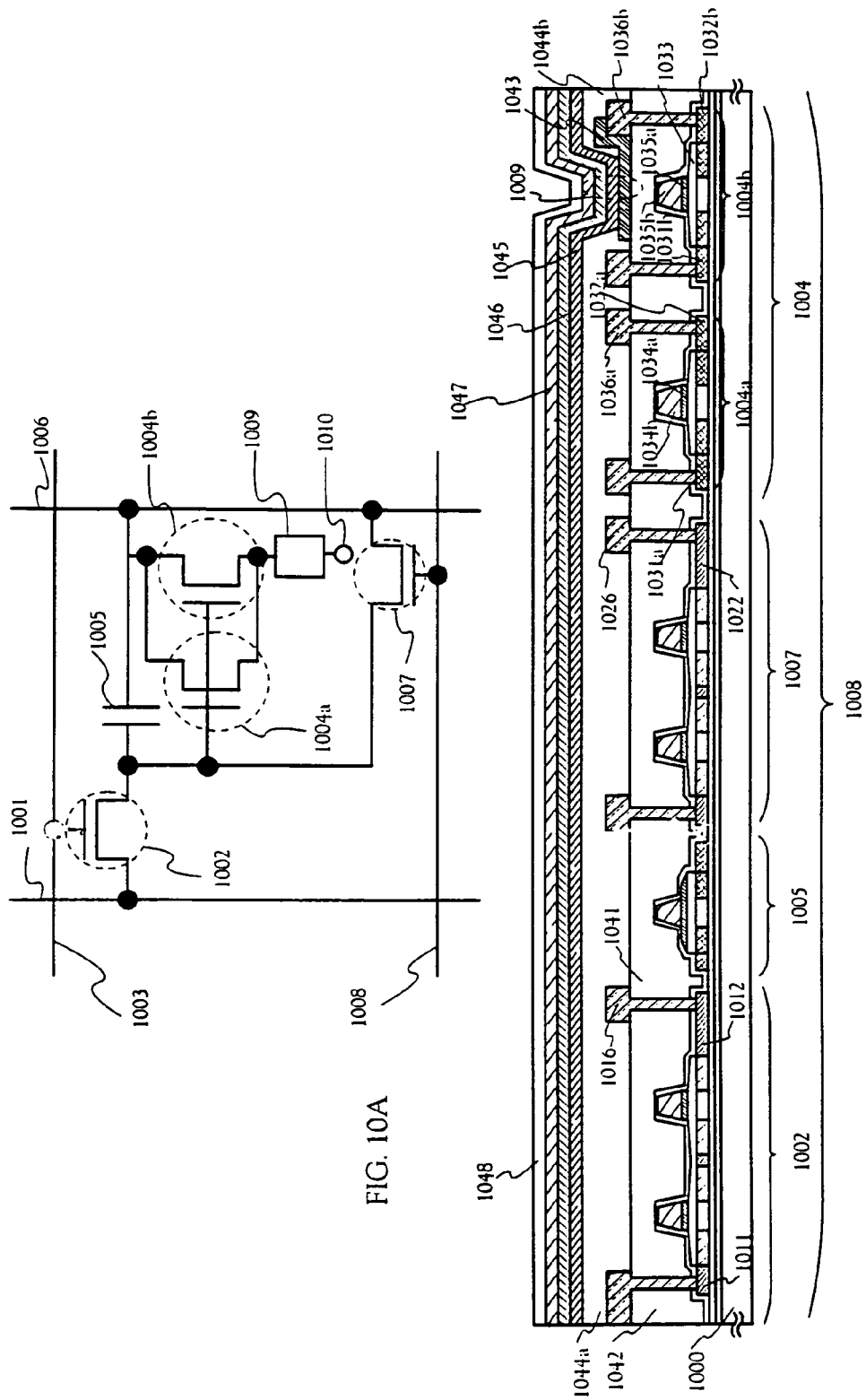

LIGHT EMITTING DEVICE INCLUDING MULTIPLE LIGHT EMITTING LAYERS

CROSS-REFERENCE TO RELATED APPLICATIONS

This application is a continuation application of U.S. application Ser. No. 09/931,050, filed on Aug. 17, 2001, now allowed, which claims the benefit of a foreign priority application filed in Japan on Aug. 18, 2000, as Ser. No. 2000-248912. This application claims priority to both of these applications, and both of these applications are incorporated by reference.

BACKGROUND OF THE INVENTION

1. Field of the Invention

The present invention relates to a light emitting device including an element (hereinafter referred to as an EL element) in which a thin film (hereinafter referred to as an organic EL film) made of an organic compound capable of obtaining EL (Electro Luminescence) is interposed between electrodes.

2. Description of the Related Art

In recent years, a technique for forming a TFT (thin film transistor) on a substrate has been greatly developed, and its application and development to an active matrix type display device (light emitting device) has been advanced. Especially, since a TFT using a polysilicon film has higher field-effect mobility (also called mobility) than that of a conventional TFT using an amorphous silicon film, a high speed operation is achieved. Thus, it becomes possible to control a pixel, which has been conventionally performed by a driving circuit external to a substrate, by a driving circuit formed on the same substrate as the pixel.

In the active matrix type light emitting device like this, various circuits and elements are formed on the same substrate, so that various merits, such as reduction in manufacturing costs, miniaturization of an electro-optical device, improvement of yield, and reduction in throughput, can be obtained.

Moreover, research of an active matrix type light emitting device including an EL element as a self-luminous element has been made active.

The EL element has such a structure that an EL layer is interposed between a pair of electrodes (anode and cathode), and in general, the EL layer has a laminate structure. Typically, there is cited a laminate structure "hole transporting layer/light emitting layer/electron transporting layer" proposed by Tang et al. of Kodak Eastman Company. This structure has very high luminous efficiency, and most of what has been studied at present adopts this structure.

In addition, the structure of layers laminated in the order of a hole injecting layer/hole transporting layer/light emitting layer/electron transporting layer or a hole injecting layer/hole transporting layer/light emitting layer/electron transporting layer/electron injecting layer on an anode may be adopted. The light emitting layer may be doped with a fluorescent pigment or the like.

In the present specification, every layer provided between a cathode and an anode is generically called an EL layer. Thus, all of the foregoing hole injecting layer, hole transporting layer, light emitting layer, electron transporting layer, electron injecting layer and the like are included in the EL layer.

A predetermined voltage is applied to the EL layer of the above structure from a pair of electrodes, and then recombination of carriers is produced in the light emitting layer to emit light. Note that in the present specification, a light emitting element formed of an anode, an EL layer and a cathode is called an EL element.

Since the deterioration of the EL layer included in the EL element is accelerated by heat, light, moisture, oxygen and the like, in general, the EL element is formed after wiring lines and TFTs are formed in a pixel portion in the manufacture of an active matrix type light emitting device.

Various methods are proposed as forming (film formation) methods of the EL layer. For example, a vacuum evaporation method, a sputtering method, a spin coating method, a roll coating method, a cast method, an LB method, an ion plating method, a dipping method, an ink jet method, a printing method and the like can be cited.

Further, in order to realize colorization of the light emitting device, for example, as disclosed in Japanese Patent Application Laid-open No. Hei. 10-012377, there is proposed a technique in which an ink jet method is used to form EL layers with different luminous colors for respective pixels.

In order to realize a high definition display in the light emitting device, an active matrix type is desirable. However, in the case where a plurality of EL layers are separately painted and are formed to realize colorization, there is a case where poor formation of the EL layer occurs due to a metal mask shift by the minute structure.

SUMMARY OF THE INVENTION

In order to solve the problem, in the present invention, a plurality of pixels arranged in one row in a pixel portion is called a pixel row, a plurality of pixels arranged in one column in the pixel portion is called a pixel column, and several kinds of EL layers are formed for every pixel group, such as a pixel row, a pixel column or a plurality of adjacent pixels, to realize multi-colorization in an active matrix type light emitting device.

In the present invention, among the pixel rows in the pixel portion, a first kind of EL layer is formed for a plurality of pixel rows from an end. Then, after a pixel row adjacent to the first kind EL layer is skipped, a second kind of EL layer is formed for a plurality of pixel rows adjacent to this. Note that a pixel row provided between the first kind of EL layer and the second kind of EL layer is referred to as a preliminary region in the present specification, and an EL layer is not formed in this preliminary region.

The preliminary region is provided as a margin for a case where a mask shift or the like occurs when the first kind of EL layer and the second kind of EL layer are formed.

Note that since a signal is not inputted to a pixel row existing in a preliminary region, even if the first kind of EL layer or the second kind of EL layer is formed in the preliminary region, there does not arise a problem.

Further, after the second kind of EL layer is formed, a preliminary region is again provided in an adjacent pixel row. That is, the EL layer and the preliminary region are alternately provided like this to prevent poor quality from being produced at the time of formation of the EL layer in the pixel portion.

Note that it is desirable to provide one to five rows of the preliminary regions formed here, that is, it is desirable to provide two to six kinds of EL layers through the preliminary regions.

As luminescent materials forming the EL layer, although well-known materials can be used, in order to improve external quantum efficiency, it is necessary to use an organic compound (hereinafter referred to as a triplet compound), which can convert triplet excitation energy into light emission (phosphorescence), for at least one kind of EL layer. Incidentally, since a material used for normal light emission is a compound which can convert singlet excitation energy into light emission, the material is referred to as a singlet compound.

As the triplet compound, organic compounds disclosed in the following papers can be cited as typical materials.

(1) T. Tsutsui. C. Adachi, S. Saito, Photochemical Processes in Organized Molecular Systems, ed. K. Honda, (Elsevier Sci. Pub., Tokyo, 1991) p. 437.
(2) M. A. Baldo, D. F. O'Brien, Y. You, A. Shoustikov, S. Sibley, M. E. Thompson, S. R. Forrest, Nature 395 (1988) p. 151.
(3) M. A. Baldo, S. Lamansky, P. E. Burrrows, M. E. Thompso, S. R. Forrest, Appl. Phys. Lett., 75 (1999) p.4
(4) T. Tsutsui, M. -J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

The organic compounds disclosed in these papers are as follows:

[Chemical Formula 1]

[Chemical Formula 1]

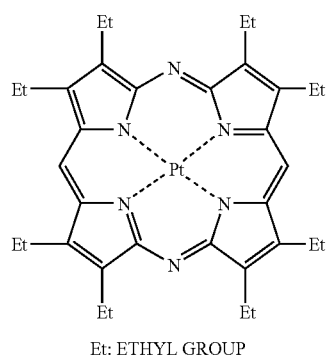

Et: ETHYL GROUP

The above molecular formula expresses a metal complex (hereinafter referred to as a platinum complex) having platinum of a third transition series element as center metal.

[Chemical Formula 2]

[Chemical Formula 2]

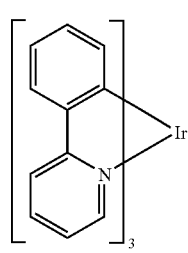

The above molecular formula expresses a metal complex (hereinafter referred to as an iridium complex) containing iridium as center metal.

Note that the triplet compound is not limited to these compounds, but a compound having the above structure and containing an element in group 8 to 10 of the periodic table as center metal can also be used.

The above triplet compound has higher luminous efficiency than the singlet compound, and the operation voltage (voltage required for making an EL element emit light) can be made low in order to obtain the same luminous brightness.

Further, in addition to the formation of the EL layer made of the same luminescent material for every plural pixel rows as described above, another form may be used which includes the EL layer formed by using the same luminescent material for a plurality of pixel columns or a plurality of adjacent pixels.

In addition, one kind of EL layer which is formed of the same luminescent material may occupy a region of 70-90% of the whole EL layers formed in the pixel portion.

By forming the EL layers as describe above, it is possible to form a multicolor light emitting device with high definition and enables reduction in consumed electric power.

BRIEF DESCRIPTION OF THE DRAWINGS

FIGS. 3A to 3C are views showing a manufacturing process of a light emitting device of Embodiment 1.

FIGS. 4A to 4C are views showing the manufacturing process of the light emitting device of Embodiment 1.

FIGS. 5A and 5B are views showing the manufacturing process of the light emitting device of Embodiment 1.

FIGS. 10A and 10B are a circuit diagram of a pixel portion of a light emitting device and a sectional view thereof of Embodiment 5.

DETAILED DESCRIPTION OF THE PREFERRED EMBODIMENTS

A method of forming a plurality of EL layers in a pixel portion according to the present invention will be described with reference to FIGS. 1A and 1B and FIGS. 2A to 2C. However, here, a description will be given of an example in which different EL layers are not separately formed, but only light emitting layers in the EL layers are separately formed. Note that in the present specification, layers in which materials used for at least light emitting layers are the same at the formation of EL layers are regarded as the same EL layers.

Figure 1A:
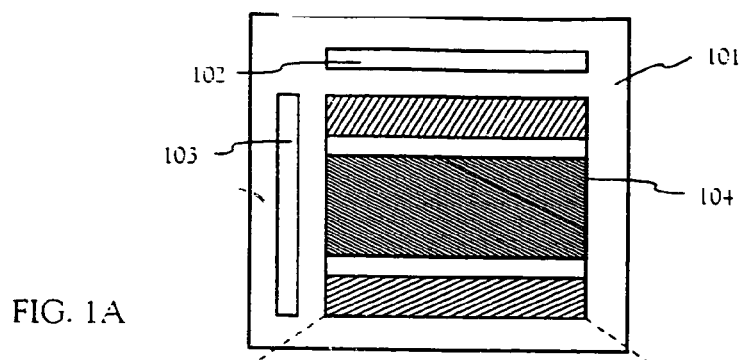
FIGS. 1A and 1B are views showing a manufacturing method of a pixel portion of a light emitting device of the present invention.

FIG. 1A is a schematic view showing the state where a source side driving circuit 102, a gate side driving circuit 103, and a pixel portion 104 are formed on a substrate 101.

Figure 1B:
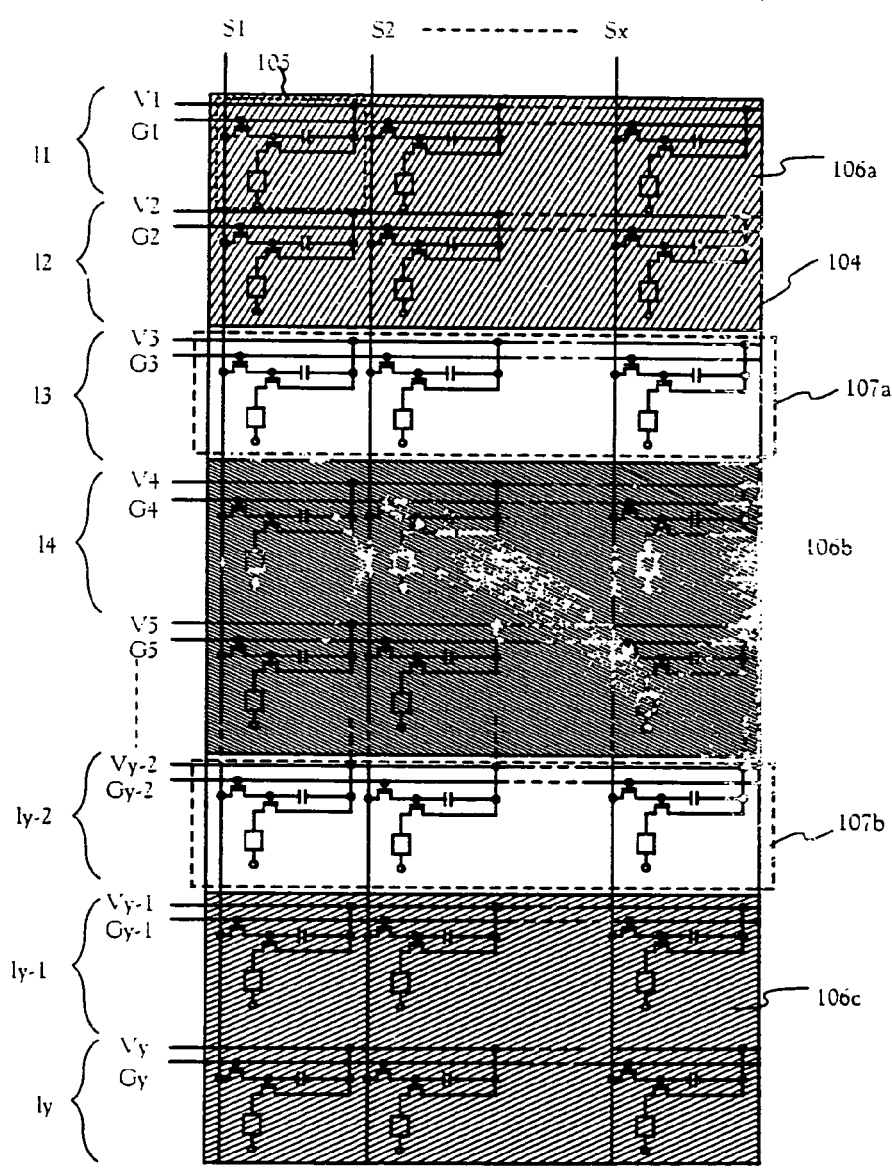
Figure 2A:
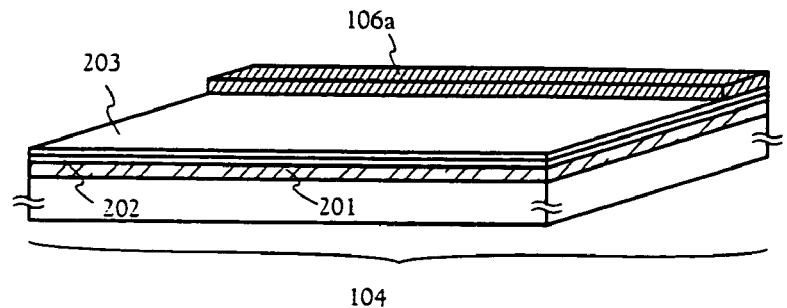
FIGS. 2A to 2C are views showing the manufacturing method of the pixel portion of the light emitting device of the present invention.
Figure 2B:
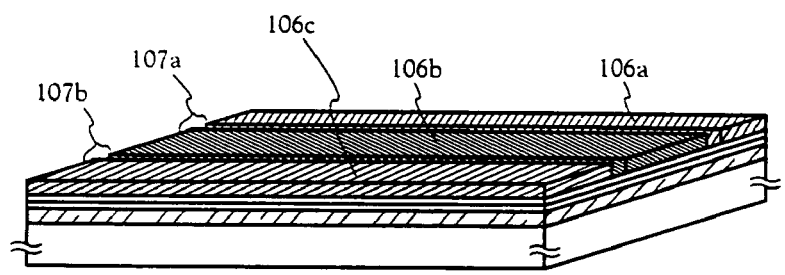
Figure 2C:
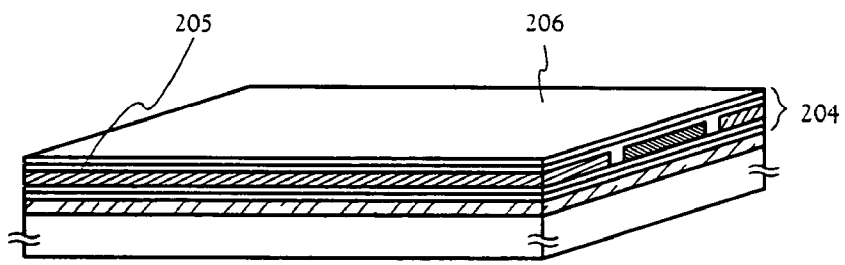

The pixel portion 104 is formed of three kinds of EL layers. Note that the present invention relates to the formation of a plurality of EL layers in the pixel portion 104 on the substrate, and FIG. 1B is an enlarged view of the pixel portion 104. FIGS. 2A to 2C are perspective views of the EL layer to be formed. Since the same symbols are used in FIGS. 1A and 1B and FIGS. 2A to 2C, the drawings may be suitably seen.

In FIG. 1B, a plurality of pixels 105 are vertically and horizontally formed side by side in the pixel portion 104. The pixel 105 is formed of a gate line (G1), a source line (S1) and a current supply line (V1) provided in the pixel portion. Further, in the pixel portion 104, the current supply lines (V1 to Vy) and the gate lines (G1 to Gy) are formed in parallel with each other and alternately.

In this embodiment, a pixel row including the gate line (G1), the source lines (S1 to Sx) and the current supply line (V1) is designated by l1 (el-one), a pixel row including the gate line (G2), the source lines (S1 to Sx) and the current supply line (V2) is designated by l2, and a pixel row including the gate line (Gy), the source lines (S1 to Sx) and the current supply line (Vy) is designated by ly.

Here, as the mode for carrying out the invention, a description will be given of a method for forming EL layers in a pixel portion in which TFTs and pixel electrodes of EL elements are formed on a substrate.

First, as shown in FIG. 2A, a hole injecting layer 202 is formed on a pixel electrode 201. At this time, as a hole injection material, it is appropriate to use a material such as copper phthalocyanine (Cu-Pc) or PEDOT which has a high degree of adhesion to an anode and a low hole injection barrier.

Next, a hole transporting layer 203 is provided. As a hole transfer material, a material such as aromatic amine α-NPD having a function to increase the speed of hole movement, 2Me-TPD, TPAC or TAD having a spiro structure is suitable.

After the hole injecting layer 202 and the hole transporting layer 203 are formed, a light emitting layer is formed.

First, a light emitting layer a (106a) is formed in the pixel rows l1 and l2 in FIG. 1B. Here, a red light emitting layer is formed, and as a material of the red light emitting layer, alumiquinolinolato complex ($Alq_3$) doped with DCM of several percents is used. An evaporation method is used for film formation, and it is appropriate that the film thickness is made 1 to 60 nm (preferably 10 to 30 nm). Incidentally, the perspective view of FIG. 2A shows the structure after the light emitting layer a (106a) is formed in the pixel portion 104.

In the pixel row l3 adjacent to the light emitting layer a (106a), a light emitting layer is not formed, but a preliminary region a (107a) is provided.

Next, a light emitting layer b (106b) is again formed in the pixel rows l4 to ly-3. Here, a green light emitting layer is formed. In the green light emitting layer, CBP doped with Ir(ppy)$_3$ of several percents is used as a triplet compound. As a specific method, CBP and Ir(ppy)$_3$ are co-deposited to form the layer. It is appropriate that the film thickness at this time is made 1 to 60 nm (preferably 10 to 30 nm).

Further, after the pixel row ly-2 is made a preliminary region b (107b), a light emitting layer c (107c) is formed in the pixel rows ly-1 and ly. Here, a blue light emitting layer is formed. In the blue light emitting layer, DPVBi of bisstyryl material is used. In addition, in the blue light emitting layer, it is appropriate that a luminescent material such as azomethine zinc complex or benzoxazole zinc complex (Zn(BOX)$_2$) is used. Further, these luminescent materials doped with perylene of several percents may be used. The evaporation method is used for film formation, and it is appropriate that the film thickness is made 1 to 60 nm (preferably 10 to 30 nm).

When the above EL layers are formed, the structure as shown in FIG. 2B is obtained. That is, the structure is obtained in which the preliminary region a (107a) is provided between the light emitting layer a (106a) and the light emitting layer b (106b), and the preliminary region b (107b) is provided between the light emitting layer b (106b) and the light emitting layer c (106c).

Incidentally, in the mode for carrying out the invention, although the example has been described in which the EL layers are formed of the red light emitting layer, the green light emitting layer and the blue light emitting layer, the kinds of the light emitting layers and the luminescent materials are merely one of preferable modes. That is, two kinds of light emitting layers may be used, or three or more kinds of light emitting layers may be used. However, if excessively many light emitting layers are formed, since the manufacture becomes difficult and it becomes difficult to achieve the object of the present invention, about six kinds of light emitting layers are preferable. Further, it is preferable that one to five rows of preliminary regions are provided.

However, in view of reduction in consumed electric power in the light emitting device, it is necessary to provide at least one light emitting layer made of a triplet compound. Note that as the light emitting layer using the triplet excitation energy there is an orange light emitting layer in which CBP is doped with octaethylporphyrin platinum complex (2,3,7,8,12,13, 17,18-octaethyl-21H, 23H-porphine platinum: PtOEP).

Further, also as the kind of color of the light emitting layer, one other than the foregoing three kinds can be used. For example, as the light emitting layer, a yellow light emitting layer can also be formed. As the luminescent material, it is appropriate that $Alq_3$ doped with Nile Red, or $BeBq_2$ or TPD doped with Rubrene is used. Note that it is appropriate that the film thickness is made 1 to 60 nm (preferably 10 to 30 nm).

Further, it is also possible to form a white light emitting layer. The white light emitting layer can be formed by doping a host light emitting layer with a luminescent pigment. In addition, the layer may be formed by laminating a layer of spiro type DTVBi and a layer of Alq3 doped with DCM. Although it is appropriate that the thicknesses of the light emitting layers by lamination are respectively made 1 to 30 nm (preferably 10 to 20 nm), they are desirably adjusted according to the intensity of light emission of each layer, and so on.

Although low molecular materials have been set forth as the luminescent materials, high molecular materials such as polyparaphenylene vinylene (PPV), polyparaphenylene, polyvinylcarbazole (PVK), polythiophene, or polyfluorene (PF) may be used. As a film formation method of the high molecular materials, an ink jet method is desirable.

As the polyparaphenylene vinylene material, poly(2,5-dialkoxy-1,4-phenylenevinylene):RO-PPV can be used, and poly(2-methoxy-5-(2-ethyl-hexoxy)-1,4-phenylenevinylene): MEH-PPV or poly(2,5-dimethylocrylsilyl-1,4-phenylenevinylene): DMOS-PPV can be used.

As the polyparaphenylene material, poly(2,5-dialkoxy-1, 4-phenylene): RO-PPP can be used.

As the polythiophene material, poly(3-alkylthiophene): PAT can be used, and poly(3-hexylthiophene): PHT, poly(3-cyclohexylthiophene): PCHT can be used. In addition, poly (3-cyclohexyl-4-methyl thiophene): PCHMT, poly(3-[4-octylphenyl]-2,2' bithiophene): PTOPT, poly(3-(4octylphenyl)-thiophene): POPT-1 or the like can also be used.

As the polyfluorene material, poly(dialkylfluorene): PDAF can be used, and specifically, poly(dioctylfluorene): PDOF can be used.

As polyacethylene material, polypropylphenyl acethylene: PPA-iPr, polybutylphenyl phenylacethylene: PDPA-nBu, polyhexylphenyl acethylene: PHPA can be used.

As a solvent of the high molecular materials, toluene, benzene, chlorobenzene, dichlorobenzene, chloroform, tetralin, xylene, anisole, dichloromethane, γbutyllactone, butylcellosolve, cyclohexane, NMP(N-methyl-2-pyrolidone), dimethyl sulfoxide, cyclohexanone, dioxane, THF(tetrahydrofuran) or the like can be used.

Further, in addition to the foregoing materials, a hole-injection high molecular material, PEDOT (poly(3,4-ethylene dioxythiophene)), or polyaniline (PA) can also be used. Incidentally, these materials use water as a solvent.

Note that these are merely examples of luminescent materials which can be used for the light emitting layer of the present invention, and the invention is not limited to these, but can freely use well-known luminescent materials.

As described above, after the plurality of light emitting layers are formed, an electron transporting layer 205 and an electron injecting layer 206 are formed. At this time, as electron transfer materials, materials having a high hole blocking property, such as Alq$_3$, 1,3,4-trioxazole derivatives and 1,2,4-triazole derivatives (TAZ) are desirable.

As materials for the formation of the electron injecting layer 206, MgAg, LiF and Li (acac) are desirable. Further, Alq$_3$ doped with alkali metal may be used.

From the above, an EL layer 204 as shown in FIG. 2C can be formed. Note that in this mode for carrying out the invention, although the description has been given of the method for forming the EL layer 204 having the structure made of the hole injecting layer 202, the hole transporting layer 203, the light emitting layers (106a to 106c), the electron transporting layer 205, and the electron injecting layer 206, the layers other than the light emitting layers may be provided if necessary.

Further, although the description has been given of the method for forming the hole injecting layer, the hole transporting layer, the electron transporting layer and the electron injecting layer by using the same material at the same time even if the luminescent material is different, the invention is not limited to these, but the layers may be separately formed by using different materials for respective EL layers.

Note that in this mode for carrying out the invention, although three kinds of light emitting layers (the light emitting layer a, the light emitting layer b, the light emitting layer c) and the preliminary regions (the preliminary region a, the preliminary region b) are formed in the pixel portion 104, a source signal is not inputted to a pixel which becomes the preliminary region. However, a source signal is inputted to a pixel in which the light emitting layer is formed, except for the preliminary region. A region made of a plurality of pixels in which a display is carried out by source signals is called a display region in the present specification.

This display region displays colors corresponding to the respective light emitting layers, so that multi-colorization on the same substrate is achieved.

Figure 11A:
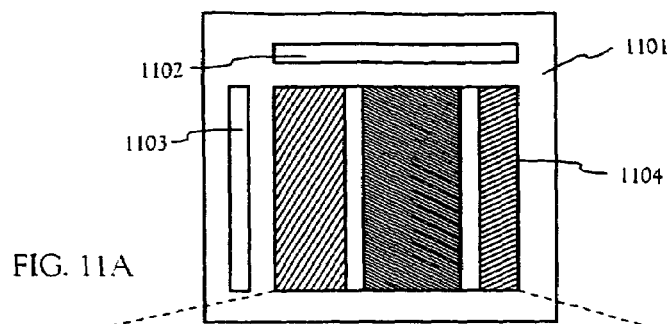
FIGS. 11A and 11B are views showing the manufacturing method of the pixel portion of the light emitting device of the present invention.
Figure 11B:
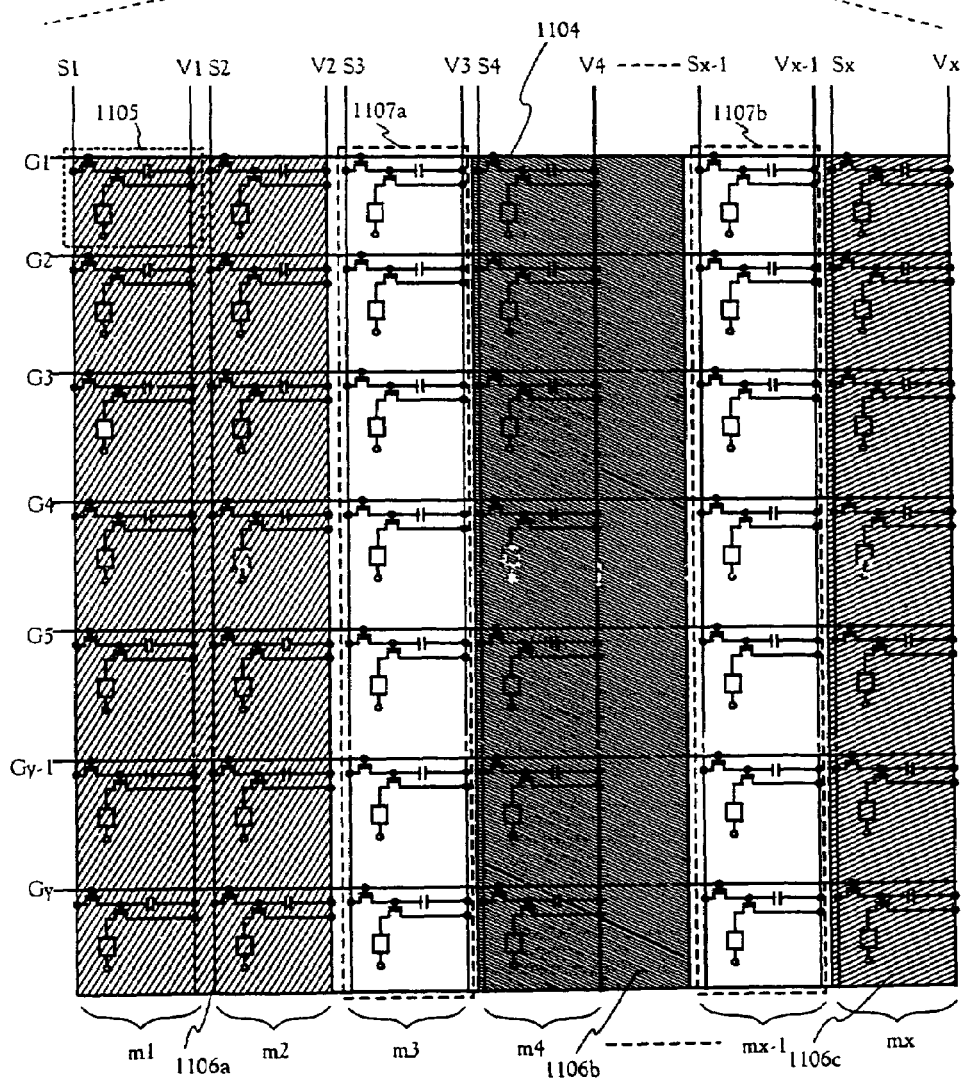

Further, as described above, the division of light emitting layers may be made different from that of FIGS. 1A and 1B. FIGS. 11A and 11B show its example. In these, it is preferable that current supply lines in pixels are arranged in conformity with the light emitting layers. In the case where the light emitting layer is divided for each row, the current supply line is arranged in parallel with the row, and in the case where the light emitting layer is divided for each column, the current supply line is arranged in parallel with the column. The details will be described in the following embodiments.

Embodiment 1

Here, a method of simultaneously manufacturing TFTs (n-channel TFT and p-channel TFT) in a pixel portion and a driver circuit provided in the periphery of the pixel portion on the same substrate and manufacturing an EL element are described in detail with reference to FIGS. 3A to 6.

First, in this embodiment, a substrate 300 is used, which is made of glass such as barium borosilicate glass or alumino borosilicate glass, typified by #7059 glass or #1737 glass of Corning Inc. There is no limitation on the substrate 300 as long as a substrate having a light transmitting property is used, and a quartz substrate may also be used. In addition, a plastic substrate having heat resistance to a treatment temperature of this embodiment may also be used.

Then, a base film 301 formed of an insulating film such as a silicon oxide film, a silicon nitride film or a silicon oxide nitride film is formed on the substrate 300. In this embodiment, a two-layer structure is used for the base film 301. However, a single layer film or a lamination structure consisting of two or more layers of the insulating film may also be used. As a first layer of the base film 301, a silicon oxide nitride film 301a is formed with a thickness of 10 to 200 nm (preferably 50 to 100 nm) using SiH$_4$, NH$_3$, and N$_2$O as reaction gases by a plasma CVD method. In this embodiment, the silicon oxide nitride film 301a (composition ratio Si=32%, O=27%, N=24% and H=17%) having a film thickness of 50 nm is formed. Then, as a second layer of the base film 301, a silicon oxide nitride film 301b is formed so as to be laminated on the first layer with a thickness of 50 to 200 nm (preferably 100 to 150 nm) using SiH$_4$ and N$_2$O as reaction gases by the plasma CVD method. In this embodiment, the silicon oxide nitride film 301b (composition ratio Si=32%, O=59%, N=7% and H=2%) having a film thickness of 100 nm is formed.

Subsequently, semiconductor layers 302 to 306 are formed on the base film 301. The semiconductor layers 302 to 306 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 302 to 306 are formed with a thickness of 25 to 80 nm (preferably 30 to 60 nm). The material of the crystalline semiconductor film is not particularly limited, but it is preferable to form the film using silicon, a silicon germanium (Si$_x$Ge$_{1-x}$ (X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to form the crystalline silicon film. Then, this crystalline silicon film is subjected to a patterning process using a photolithography method to obtain the semiconductor layers 302 to 306.

Further, after the formation of the semiconductor layers 302 to 306, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or YVO$_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 300 Hz, and a laser energy density is set to 100 to 400 mJ/cm$^2$ (typically 200 to 300 mJ/cm$^2$). In the case where the YAG laser is used, it is appropriate to set a pulse oscillation frequency as 30 to 300 Hz using the second harmonic, and to set a laser energy density to 300 to 600 mJ/cm$^2$ (typically, 350 to 500 mJ/cm$^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 307 is then formed for covering the semiconductor layers 302 to 306. The gate insulating film 307 is formed of an insulating film containing silicon with a thickness of 40 to 150 nm by a plasma CVD or sputtering method. In this embodiment, the gate insulating film is formed of a silicon oxide nitride film with a thickness of 110 nm by the plasma CVD method (composition ratio Si=32%, O=59%, N=7%, and H=2%). Of course, the gate insulating film is not limited to the silicon oxide nitride film, and other insulating films containing silicon may be used with a single layer or a lamination structure.

Besides, when a silicon oxide film is used, it can be formed such that TEOS (tetraethyl orthosilicate) and O$_2$ are mixed by the plasma CVD method with a reaction pressure of 40 Pa and a substrate temperature of 300 to 400° C., and discharged at a high frequency (13.56 MHz) power density of 0.5 to 0.8 W/cm$^2$. The silicon oxide film thus manufactured can obtain satisfactory characteristics as the gate insulating film by subsequent thermal annealing at 400 to 500° C.

Then, as shown in FIG. 3A, a first conductive film 308 of 20 to 100 nm thickness and a second conductive film 309 of 100 to 400 nm thickness are formed into lamination on the gate insulating film 307. In this embodiment, the first conductive film 308 made of a TaN film with a thickness of 30 nm and the second conductive film 309 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride (WF$_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 308 is made of TaN, and the second conductive film 309 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Next, as shown in FIG. 3B, masks 310 to 314 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which CF$_4$, Cl$_2$, and O$_2$ are used as etching gases, a gas flow rate is set to 25/25/10 sccm, and an RF (13.56 MHz) power of 500 W is applied to a coil shape electrode (diameter: 25 cm) under a pressure of 1 Pa to generate plasma. Thus, the etching is performed. A dry etching device using ICP (Model E645-☐ICP) manufactured by Matsushita Electric Industrial Co. is used here. A 150 W RF (13.56 MHz) power is also applied to the substrate side (sample stage), using an electrode having an electrode size of 12.5 cm×12.5 cm, thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32 nm/min, and the selectivity of W to TaN is about 2.5. Further, the taper angle of W is about 26° under the first etching condition.

Thereafter, as shown in FIG. 3B, the etching condition is changed into the second etching condition without removing the masks 310 to 314 made of resist, and the etching is performed for about 30 seconds, in which CF$_4$ and Cl$_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which CF$_4$ and Cl$_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the masks formed of resist suitable, end portions of the first conductive layer and the second conductive layer become tapered shape by the effect of the bias voltage applied to the substrate side. The angle of the taper portion may be 15 to 45°. In this way, first shape conductive layers 315 to 319 consisting of the first conductive layer and the second conductive layer (first conductive layers 315a to 319a and second conductive layers 315b to 319b) are formed by the first etching process. Reference numeral 320 indicates a gate insulating film, and the regions not covered with the first shape conductive layers 315 to 319 are made thinner by approximately 20 to 50 nm by etching.

Then, a first doping process is performed to add an impurity element imparting n-type conductivity to the semiconductor layer without removing the masks made of resist (FIG. 3B). Doping may be carried out by an ion doping method or an ion injecting method. The condition of the ion doping method is that a dosage is $1\times10^{13}$ to $5\times10^{15}$ atoms/cm$^2$, and an acceleration voltage is 60 to 100 keV. In this embodiment, the dosage is $1.5\times10^{15}$ atoms/cm$^2$ and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 315 to 319 become masks for the impurity element imparting n-type conductivity, and high concentration impurity regions 321 to 325 are formed in a self-aligning manner. The impurity element imparting n-type conductivity in a concentration range of $1\times10^{20}$ to $1\times10^{21}$ atoms/cm$^3$ is added to the high concentration impurity regions 321 to 325.

Thereafter, as shown in FIG. 3C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 330b to 334b are formed by the second etching process. On the other hand, the first conductive layers 315a to 319a are hardly etched, and first conductive layers 330a to 334a are formed.

Next, a second doping process is performed. The second conductive layers 330b to 334b are used as masks for an impurity element, and doping is performed such that the impurity element is added to the semiconductor layer below the tapered portions of the first conductive layers. In this embodiment, phosphorus (P) is used as the impurity element, and plasma doping is performed with a dosage of $1.5\times10^{14}$ atoms/cm$^2$, a current density of 0.5 μA, and an acceleration voltage of 90 keV. Thus, low concentration impurity regions 330 to 340, which overlap with the first conductive layers, are formed in a self-aligning manner. The concentration of phosphorus (P) added to the low concentration impurity regions 340 to 344 is $1\times10^{17}$ to $5\times10^{18}$ atoms/cm$^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 321 to 325 to form high concentration impurity regions 345 to 349 (FIG. 4A).

Thereafter, as shown in FIG. 4B, after the masks made of resist are removed, a third etching process is performed using a photolithography method. The tapered portions of the first conductive layers are partially etched so as to have shapes overlapping the second conductive layers in the third etching process. Incidentally, as shown in FIG. 4B, masks 350 and 351 made of resist are formed in the regions where the third etching process is not conducted.

The etching condition in the third etching process is that $Cl_2$ and $SF_6$ are used as etching gases, the gas flow rate is set to 10/50 sccm, and the ICP etching method is used same as the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 340a to 342a are formed.

Impurity regions (LDD regions) 355 to 357, which do not overlap the first conductive layers 352a to 354a, are formed by the third etching process. Note that impurity regions (GOLD regions) 340 and 342 remains overlapping the first conductive layers 330a and 332a.

Further, the electrode constituted of the first conductive layer 330a and the second conductive layer 330b finally becomes the gate electrode of the n-channel TFT of the driver circuit, and the electrode constituted of the first conductive layer 352a and a second conductive layer 352b finally becomes the gate electrode of the p-channel TFT of the driver circuit.

Similarly, the electrode constituted of the first conductive layer 353a and a second conductive layer 353b finally becomes the gate electrode of the n-channel TFT of the pixel portion, and the electrode constituted of the first conductive layer 354a and a second conductive layer 354b finally becomes the gate electrode of the p-channel TFT of the pixel portion. Further, the electrode constituted of the first conductive layer 332a and the second conductive layer 332b finally becomes one of electrodes of a capacitor (storage capacitor) of the pixel portion.

In this way, in this embodiment, the impurity regions (LDD regions) 355 to 357 that do not overlap the first conductive layers 352a to 354a and the impurity regions (GOLD regions) 340 and 342 that overlap the first conductive layers 330a and 332a can be simultaneously formed. Thus, different impurity regions can be formed in accordance with the TFT characteristics.

Next, the gate insulating film 320 is subjected to an etching process. In this etching process, $CHF_3$ is used as an etching gas, and a reactive ion etching method (RIE method) is used. In this embodiment, a fourth etching process is conducted with a chamber pressure of 6.7 Pa, RF power of 800 W, and a gas flow rate of $CHF_3$ of 35 sccm. Thus, parts of the high concentration impurity regions 345 to 349 are exposed, and insulating films 360 to 364 are formed separately.

Subsequently, after the masks made of resist are removed, masks 365 and 366 made of resist are newly formed to thereby perform a third doping process. By this third doping process, impurity regions 370 to 375 added with an impurity element imparting conductivity (p-type) opposite to the above conductivity (n-type) are formed in the semiconductor layers that become active layers of the p-channel TFT (FIG. 4C). The second conductive layers 352b, 332b, and 354b are used as masks for the impurity element, and the impurity element imparting p-type conductivity is added to form the impurity regions in a self-aligning manner.

In this embodiment, the impurity regions 370 to 375 are formed by an ion doping method using diborane ($B_2H_6$). The impurity regions 370 to 375 are respectively added with phosphorous at different concentrations by the first doping process and the second doping process. In any of the regions, the doping process is conducted such that the concentration of the impurity element imparting p-type conductivity becomes $2\times10^{20}$ to $2\times10^{21}$ atoms/cm$^3$. Thus, the impurity regions function as source and drain regions of the p-channel TFT, and therefore, no problem occurs.

Through the above-described processes, the impurity regions are formed in the respective semiconductor layers. Note that, in this embodiment, a method of conducting doping of the impurities (boron) after etching the gate insulating film is shown, but doping of the impurities may be conducted before etching the gate insulating film.

Subsequently, the masks 365 and 366 made of resist are removed, and as shown in FIG. 5A, a first interlayer insulating film 376 is formed. As the first interlayer insulating film 376, an insulating film containing silicon is formed with a thickness of 100 to 200 nm by a plasma CVD method or a sputtering method. In this embodiment, a silicon oxide nitride film of 150 nm thickness is formed by the plasma CVD method. Of course, the first interlayer insulating film 376 is not limited to the silicon oxide nitride film, and other insulating films containing silicon may be used in a single layer or a lamination structure.

Then, a process of activating the impurity element added to the semiconductor layers is performed. This activation process is performed by a thermal annealing method using an annealing furnace. The thermal annealing method may be performed in a nitrogen atmosphere with an oxygen concentration of 1 ppm or less, preferably 0.1 ppm or less and at 400 to 700° C., typically 500 to 550° C. In this embodiment, the activation process is conducted by a heat treatment for 4 hours at 550° C. Note that, in addition to the thermal annealing method, a laser annealing method or a rapid thermal annealing method (RTA method) can be applied.

Note that, in this embodiment, with the activation process, nickel used as a catalyst in crystallization is gettered to the impurity regions (345, 348, 370, 372 and 374) containing phosphorous at high concentration, and the nickel concentration in the semiconductor layer that becomes a channel forming region is mainly reduced. The TFT thus manufactured having the channel forming region has the lowered off current value and good crystallinity to obtain a high electric field effect mobility. Thus, the satisfactory characteristics can be attained.

Further, the activation process may be conducted before the formation of the first interlayer insulating film. Incidentally, in the case where the used wiring material is weak to heat, the activation process is preferably conducted after the formation of the interlayer insulating film (insulating film containing silicon as its main constituent, for example, silicon nitride film) in order to protect wirings and the like as in this embodiment.

Furthermore, after the activation process, the doping process may be conducted to form the first interlayer insulating film.

Moreover, a heat treatment is carried out at 300 to 550° C. for 1 to 12 hours in an atmosphere containing hydrogen of 3 to 100% to perform a process of hydrogenating the semiconductor layers. In this embodiment, the heat treatment is conducted at 41 ° C. for 1 hour in a nitrogen atmosphere containing hydrogen of approximately 3%. This is a process of terminating dangling bonds in the semiconductor layer by hydrogen included in the interlayer insulating film. As another means for hydrogenation, plasma hydrogenation (using hydrogen excited by plasma) may be performed.

In addition, in the case where the laser annealing method is used as the activation process, after the hydrogenation process, laser light emitted from an excimer laser, a YAG laser or the like is desirably irradiated.

Next, as shown in FIG. 5B, a second interlayer insulating film 380, which is made from an organic insulating material, is formed on the first interlayer insulating film 376. In this embodiment, an acrylic resin film is formed with a thickness of 1.6 µm. Then, patterning for forming contact holes that reach the respective impurity regions 345, 348, 370, 372 and 374 is conducted.

As the second interlayer insulating film 380, a film made from an insulating material containing silicon or an organic resin is used. As the insulating material containing silicon, silicon oxide, silicon nitride, or silicon oxide nitride may be used. As the organic resin, polyimide, polyamide, acrylic, BCB (benzocyclobutene), or the like may be used.

In this embodiment, the silicon oxide nitride film formed by a plasma CVD method is formed. Note that the thickness of the silicon oxide nitride film is preferably 1 to 5 µm (more preferably 2 to 4 µm). The silicon oxide nitride film has a little amount of moisture contained in the film itself, and thus, is effective in suppressing deterioration of the EL element. Further, dry etching or wet etching may be used for the formation of the contact holes. However, taking the problem of electrostatic destruction in etching into consideration, the wet etching method is desirably used.

Moreover, in the formation of the contact holes here, the first interlayer insulating film and the second interlayer insulating film are etched at the same time. Thus, in consideration for the shape of the contact hole, it is preferable that the material with an etching speed faster than that of the material for forming the first interlayer insulating film is used for the material for forming the second interlayer insulating film.

Then, wirings 381 to 388, which are electrically connected with the impurity regions 345, 348, 370, 372 and 374, respectively, are formed. The wirings are formed by patterning a lamination film of a Ti film of 50 nm thickness and an alloy film (alloy film of Al and Ti) of 500 nm thickness, but other conductive films may also be used.

Subsequently, a transparent conductive film is formed thereon with a thickness of 80 to 120 nm, and by patterning the transparent conductive film, a pixel electrode 389 is formed (FIG. 5B). Note that, in this embodiment, an indium tin oxide (ITO) film or a transparent conductive film in which indium oxide is mixed with zinc oxide (ZnO) of 2 to 20% is used as the transparent electrode.

Further, the pixel electrode 389 is formed so as to contact and overlap the drain wiring 387, thereby having electrical connection with a drain region of a current control TFT.

Figure 6:
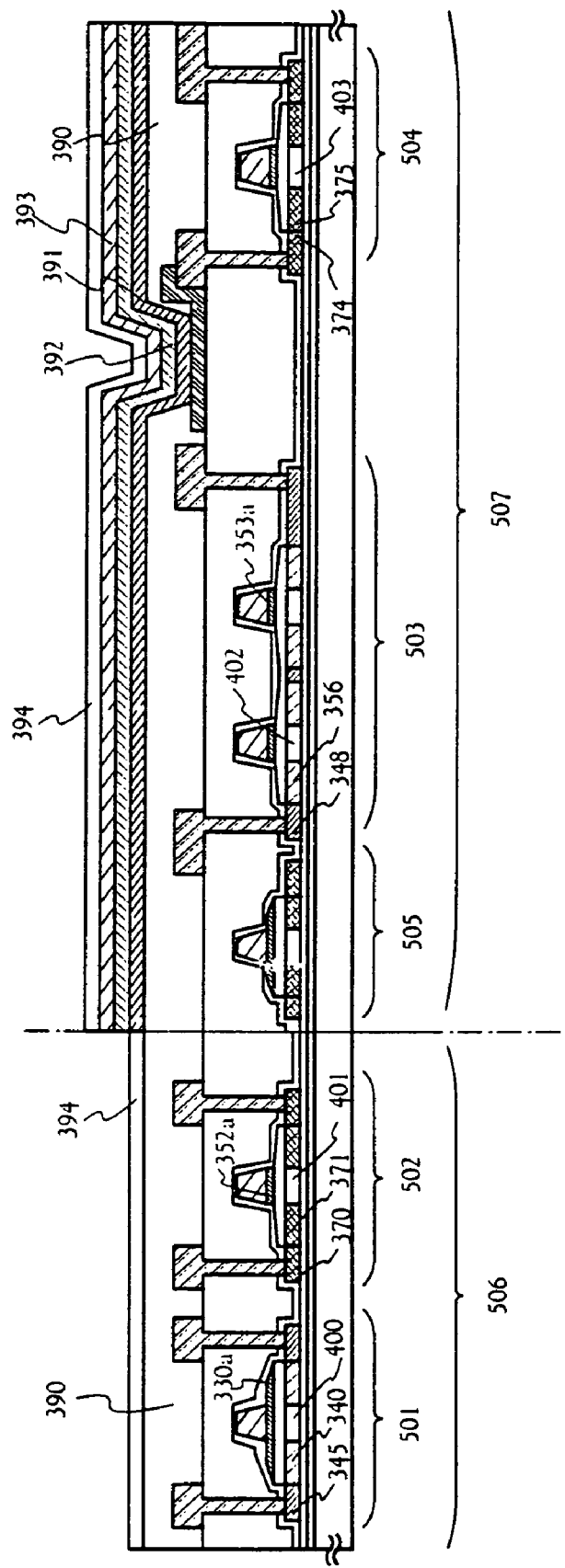
FIG. 6 is a view showing the manufacturing process of the light emitting device of Embodiment 1.

Next, as shown in FIG. 6, an insulating film containing silicon (a silicon oxide film in this embodiment) is formed with a thickness of 500 nm, and an opening portion is formed at the position corresponding to the pixel electrode 389 to thereby form a third interlayer insulating film 390 functioning as a bank. In forming the opening portion, side walls with a tapered shape may easily be formed by using the wet etching method. If the side walls of the opening portion are not sufficiently gentle, the deterioration of the EL layer caused by a step becomes a marked problem. Thus, attention is required.

Note that, in this embodiment, the silicon oxide film is used as the third interlayer insulating film, but depending on the situation, an organic resin film made of polyimide, polyamide, acrylic, or BCB (benzocyclobutene) may also be used.

Next, as shown in FIG. 6, an EL layer 391 is formed by an evaporation method. Here, a state is shown in which one kind of layer in a plurality of EL layers formed in the present invention is formed.

First, PEPOT is formed on the pixel electrode 389 by a spin coating method. Next, MTDATA is evaporated to form a hole injecting layer (not shown). Further, S-TAD (spiro type TAD) is evaporated to form a hole transporting layer (not shown).

Here, a light emitting layer made of spiro type DTVBi is formed by the evaporation method. This is a luminescent material showing blue light emission in a single layer. The film thickness at this time is 1 to 40 nm, and a light emitting layer of $Alq_3$ doped with DCM is further formed on the DTVBi by a codeposition method. This is a luminescent material showing red light emission in a single layer. The film thickness is 1 to 40 nm. When the light emitting layer is made to have a laminate structure of the above two layers, a white light emitting layer can be formed.

Further, as described in the mode for carrying out the invention, after another light emitting layer is formed, $Alq_3$ is evaporated as an electron transporting layer (not shown). The film thickness at this time is preferably made 1 to 50 nm. The EL layer is formed from the above.

Further, a cathode (MgAg electrode) 392 and a protective electrode 393 are formed by the evaporation method. At this time, it is desirable that a heat treatment is carried out to the pixel electrode 389 before the EL layer 391 and the cathode 392 are formed, so that moisture is completely removed. Note that in this embodiment, although the MgAg electrode is used as the cathode of the EL layer, AlLi alloy, a material made of an element in group 1 or group 2 of the periodic table and aluminum, or the like may be used, and another well-known material may be used.

The protective electrode 393 is provided to prevent deterioration of the cathode 392, and a metal film containing aluminum as its main ingredient is typical. Of course, another material may be used. Since the EL layer 391 and the cathode 392 are very sensitive to moisture, it is desirable that the films up to the formation of the protective electrode 393 are continuously formed without opening to the air, and the EL layer is protected from the open air.

As a material for the formation of the EL layer 391, a well-known material can be used. In this embodiment, although the four-layer structure made of the hole injecting layer, the hole transporting layer, the emitting layer, and the electron transporting layer is made the EL layer, there is also a case where an electron injecting layer is further provided, or some of the layers other than the light emitting layer is missing. Various examples have been reported for such combination, and any structure of those may be used.

Although the protective electrode 393 can protect the EL layer 391 against moisture or oxygen, more desirably, a passivation film 394 is provided. In this embodiment, as the passivation film, a silicon nitride film having a thickness of 300 nm is provided. This passivation film may be continuously formed without opening to the air after the protective film 393.

Note that the film thickness of the EL layer 391 is preferably made 10 to 400 nm (typically 60 to 150 nm), and the thickness of the cathode 392 is preferably made 80 to 200 nm (typically 100 to 150 nm).

In this way, the structure as shown in FIG. 6 is completed. In the present specification, what is manufactured to have the structure as shown in FIG. 6 is called an EL module. In the manufacturing process of the EL module in this embodiment, in connection with the structure of the circuit and the process, the source signal line is formed of Ta, W as the material forming the gate electrode, and the gate signal line is formed of Al as the wiring material forming the source and drain electrodes, however, a different material may be used.

Further, a driving circuit 506 including an n-channel TFT 501 and a p-channel TFT 502 and a pixel portion 507 including a switching TFT 503, a current controlling TFT 504 and a capacitor 505 can be formed on the same substrate.

In this embodiment, although the structure is shown in which the n-channel TFT is used for the switching TFT 503 and the p-channel TFT is used for the current controlling TFT 504 since lower-surface outgoing radiation occurs from the element structure of the EL element, this embodiment is merely a preferred example, and the invention is not limited to this.

The n-channel TFT 501 of the driving circuit 506 includes a channel formation region 400, the low concentration impurity region 340 (GOLD region) overlapping with the first conductive layer 330a constituting a part of the gate electrode, and the high concentration impurity region 345 functioning as the source region or the drain region. The p-channel TFT 502 includes a channel formation region 401, and the impurity regions 370 and 371 functioning as the source region or the drain region.

The switching TFT 503 of the pixel portion 507 includes a channel formation region 402, the low concentration impurity region 356 (LDD region) not overlapping with the first conductive layer 353a forming the gate electrode but formed at the outside of the gate electrode, and the high concentration impurity region 348 functioning as the source region or the drain region.

The current controlling TFT 504 of the pixel portion 507 includes a channel formation region 403, and the high concentration impurity regions 374 and 375 functioning as the source region or the drain region. The capacitor 505 is formed such that the first conductive layer 332a and the second conductive layer 332b function as one of electrodes.

Note that in this embodiment, although the structure is shown in which the cathode is formed after the EL layer is formed on the pixel electrode (anode), a structure may be adopted in which an EL layer and an anode are formed on a pixel electrode (cathode). However, in this case, the form of upper-surface outgoing radiation is adopted, not that of the lower-surface outgoing radiation described above. At this time, it is desirable that the switching TFT and the current controlling TFT are formed of the n-channel TFT including the low concentration impurity region (LDD region) described in this embodiment.

In this embodiment, the driving voltage of a TFT is 1.2 to 10 V, preferably 2.5 to 5.5 V.

When the display of the pixel portion is active (case of the moving picture display), a background is displayed by pixels in which the EL elements emit light and a character is displayed by pixels in which the EL elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which EL elements emit light (also called a character display), and a background is displayed by pixels in which EL elements do not emit light (also called a background display).

Embodiment 2

In this embodiment, a method of completing the EL module shown in FIG. 6 as a light emitting device is described with reference to FIGS. 7A and 7B.

Figure 7A:
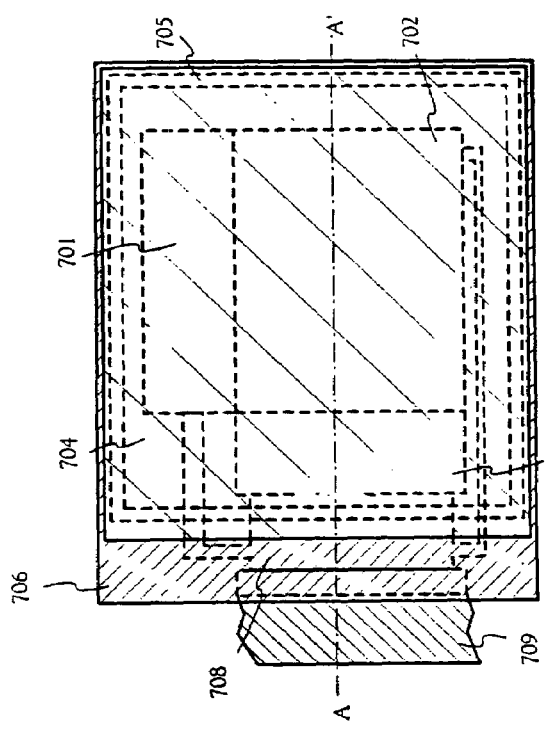
FIGS. 7A and 7B are views showing a sealing structure of a light emitting device of Embodiment 2.
Figure 7B:
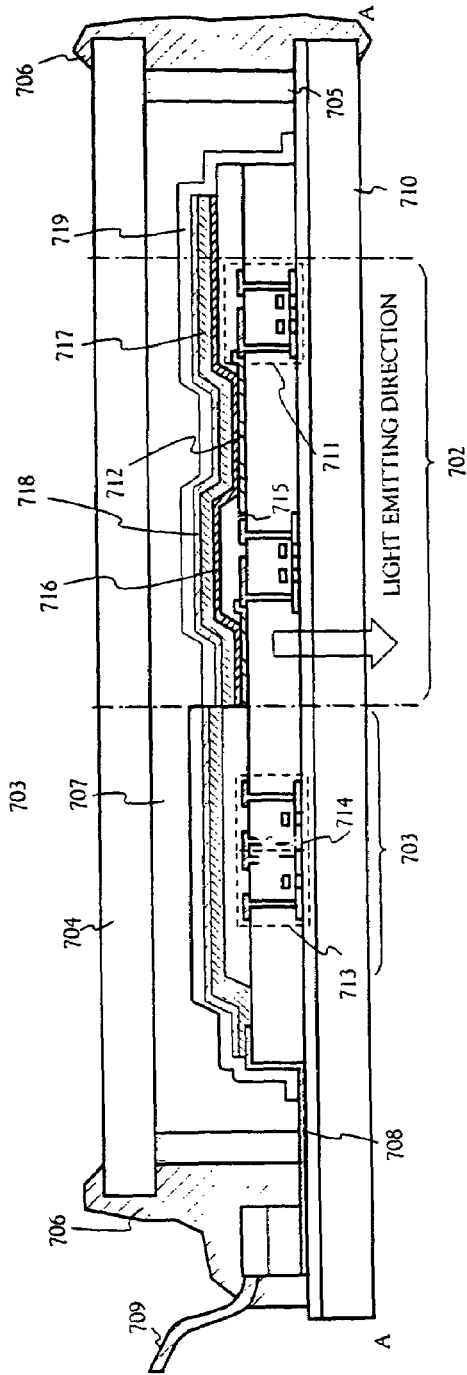

FIG. 7A is a top surface diagram showing a state completed up through sealing of an EL element. FIG. 7B is a cross sectional view taken along a line A-A' of FIG. 7A. Reference numeral 701 indicated by a dotted line indicates a source side driver circuit, reference numeral 702 indicates a pixel portion, and reference numeral 703 indicates a gate side driver circuit. Further, reference numeral 704 indicates a cover member, reference numeral 705 indicates a first sealant, and reference numeral 706 indicates a second sealant. The inside surrounded by the first sealant 705 is a space.

Note that reference numeral 708 indicates a wiring for transmitting a signal input to the source side driver circuit 701 and the gate side driver circuit 703, and the wiring receives a video signal or a clock signal from an FPC (flexible printed circuit) 709 as an external input terminal. Although only the FPC is shown in the figure, the FPC may be attached with a print wiring board (PWB). The light emitting device in this specification includes not only the light emitting device itself but also the light emitting device attached with the FPC or PWB.

Next, the cross sectional structure is explained with reference to FIG. 7B. The pixel portion 702 and the gate side driver circuit 703 are formed above a substrate 710, and the pixel portion 702 is formed of a plurality of pixels each including a current control TFT 711 and a pixel electrode 712 electrically connected with the drain. Further, the gate side driver circuit 703 is formed by using a CMOS circuit (see FIGS. 5A and 5B) in which an n-channel TFT 713 and a p-channel TFT 714 are combined.

A pixel electrode 712 functions as an anode of the EL element. Further, a bank 715 is formed at each end of the pixel electrode 712, and an EL layer 716 and a cathode 717 of the EL element are formed on the pixel electrode 712.

The cathode 717 also functions as a common wiring to all the pixels, and is electrically connected with the FPC 709 through the connection wiring 708. Further, all the elements included in the pixel portion 702 and the gate side driver circuit 703 are covered with the cathode 717 and a passivation film 718.

Moreover, the cover member 704 is bonded by the first sealant 705. Note that a spacer made of a resin film may be provided in order to secure the interval between the cover member 704 and the EL element. A space 707 inside the first sealant 705 is filled with an inert gas such as nitrogen. Note that an epoxy-based resin is preferably used as the first sealant 705. Besides, it is desirable that the first sealant 705 is a material that does not permeated with moisture or oxygen as much as possible. Further, a substance with a moisture absorbing effect or a substance with an effect of preventing oxidization may be included in the space 707.

Furthermore, in this embodiment, FRP (fiberglass-reinforced plastics), PVF (polyvinyl fluoride), mylar, polyester, or acrylic may be used as a material for a plastic substrate constituting the cover member 704.

In addition, after the cover member 704 is bonded using the first sealant 705, the second sealant 706 is provided so as to cover the side surface (exposing surface). Note that the same material as for the first sealant 705 may be used for the second sealant 706.

The EL element is sealed into the space 707 with the above structure, whereby the EL element can be shut out from the outside. Thus, a substance that promotes deterioration of the EL layer due to oxidization, such as moisture or oxygen can be prevented from permeating from the outside. Therefore, the light emitting device with high reliability can be obtained.

Note that the structure of this embodiment can be implemented by freely combining it with any structure of Embodiment 1.

Embodiment 3

Figure 8A:
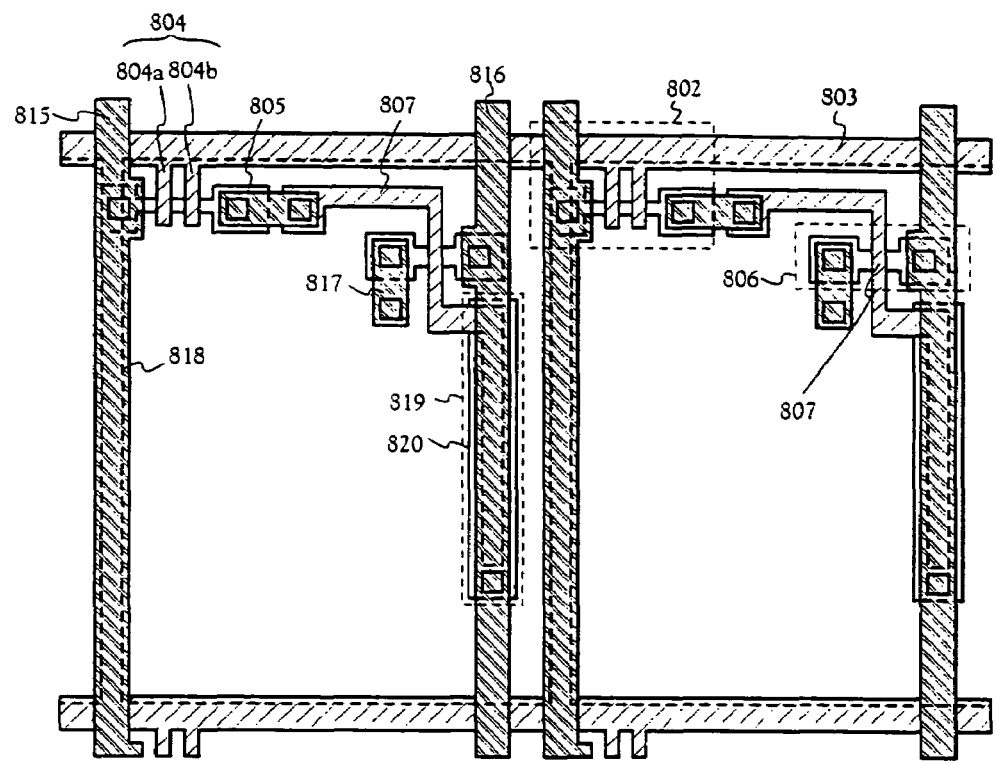
FIGS. 8A and 8B are views showing an upper structure of a pixel portion of a light emitting device and a circuit diagram of Embodiment 3.
Figure 8B:
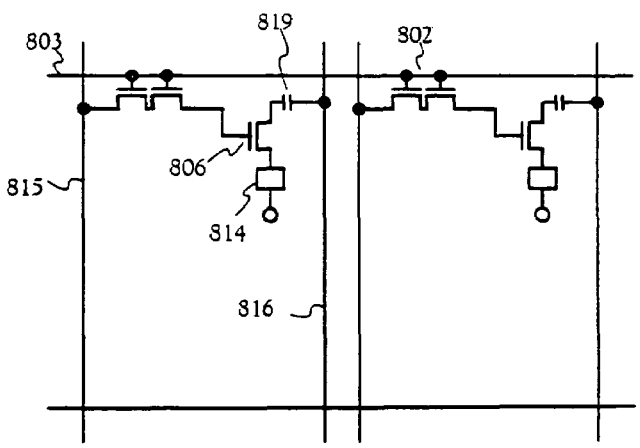

A detailed top surface structure of a pixel portion is shown in FIG. 8A, and a circuit diagram thereof is shown in FIG. 8B. In FIGS. 8A and 8B, a switching TFT 804 provided on a substrate is formed by using the switching TFT (n-channel type) TFT 503 of FIG. 6. Therefore, an explanation of the switching (n-channel type) TFT 503 may be referred for an explanation of the structure. Further, a wiring indicated by reference numeral 803 is a gate wiring for electrically connecting with gate electrodes 804a and 804b of the switching TFT 804.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 804 is connected to a source wiring 815, and a drain thereof is connected to a drain wiring 805. The drain wiring 805 is electrically connected with a gate electrode 807 of a current control TFT 806. Note that the current control TFT 806 is formed by using the current control (p-channel type) TFT 504 of FIG. 6. Therefore, an explanation of the current control (p-channel type) TFT 504 may be referred for an explanation of the structure. Note that, although the single gate structure is adopted in this embodiment, the double gate structure or the triple gate structure may also be adopted.

Further, a source of the current control TFT 806 is electrically connected with a current supply line 816, and a drain thereof is electrically connected with a drain wiring 817. Besides, the drain wiring 817 is electrically connected with a pixel electrode (anode) 818 indicated by a dotted line.

At this time, a storage capacitor (condenser) is formed in a region indicated by reference numeral 819. The capacitor 819 is formed by a semiconductor film 820 electrically connected with the current supply line 816, an insulating film (not shown) of the same layer as a gate insulating film, and the gate electrode 807. Further, a capacitor formed by the gate electrode 807, the same layer (not shown) as a first interlayer insulating film, and the current supply line 816 may be used as a storage capacitor.

Note that the structure of this embodiment can be implemented by freely combining it with any structure of Embodiment 1 and Embodiment 2.

Embodiment 4

Figure 9A:
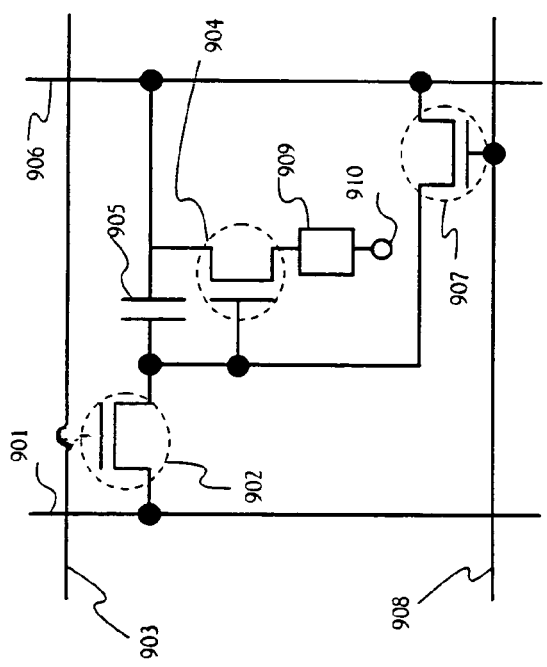
FIGS. 9A and 9B are a circuit diagram of a pixel portion of a light emitting device and a sectional view thereof of Embodiment 4.
Figure 9B:
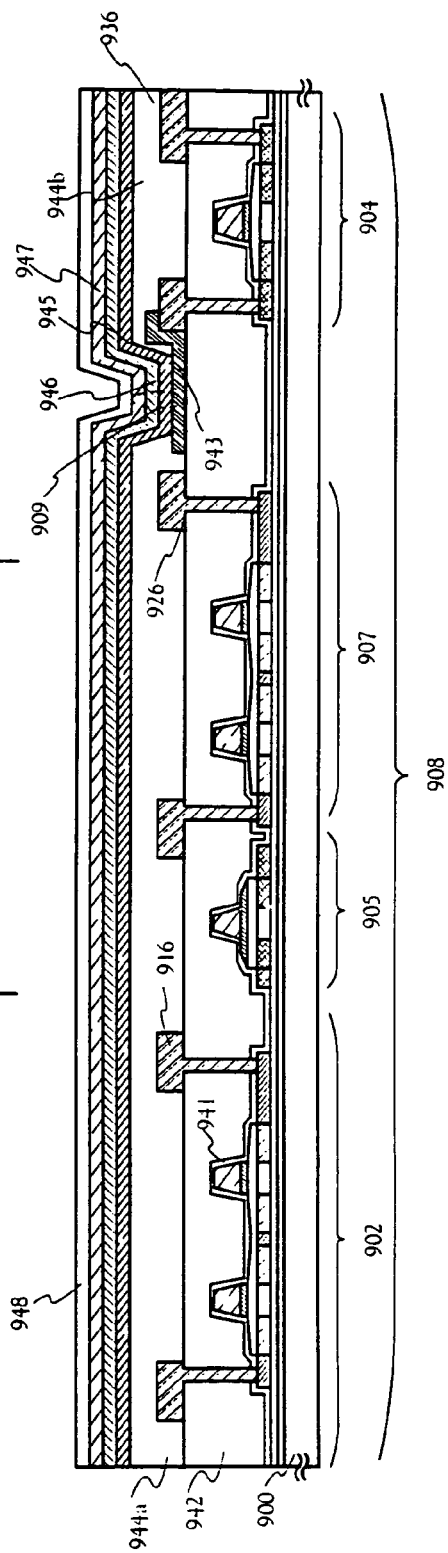

In this embodiment, FIG. 9A shows an example of a pixel structure in a pixel portion of a light emitting device in which the present invention is carried out in a structure different from the embodiment 1, and FIG. 9B shows a sectional structure of the pixel portion.

First, in FIG. 9A, reference numeral 901 designates a source signal line connected to a source of a switching TFT 902; and 903, a writing gate signal line connected to a gate of the switching TFT 902. Reference numeral 904 designates a current controlling TFT; and 905, a capacitor (it can also be omitted). Reference numeral 906 designates a current supply line; and 907, an erasing TFT which is connected to an erasing gate signal line 908. Reference numeral 909 designates an EL element; and 910, a counter power supply. With respect to the operation of the erasing TFT 907, Japanese Patent Application No. Hei. 11-338786 may be consulted.

A drain of the erasing TFT 907 is connected to a gate electrode of the current controlling TFT 904, and the gate voltage of the current controlling TFT 904 can be forcibly changed. Although the erasing TFT may be made an n-channel TFT or a p-channel TFT, it is preferably made to have the same structure as the switching TFT 902 so that an off current can be made small.

Next, the sectional structure will be described.

In FIG. 9B, an n-channel TFT formed by using a well-known method is used as the switching TFT 902 provided on a substrate 900.

In this embodiment, a double gate structure is adopted. By making the double gate structure, a structure is obtained in which two TFTs are substantially connected in series, and there is a merit that an off current value can be reduced. Further, a p-channel TFT formed by using a well-known method may be used.

Next, an n-channel TFT formed by using a well-known method is used as the erasing TFT 907. Note that a p-channel TFT formed by using a well-known method may be used. A drain wiring line 926 of the erasing TFT 907 is electrically connected to a drain wiring line 916 of the switching TFT 902 and a gate electrode 935 (935*a*, 935*b*) of the current controlling TFT through different wiring lines.

In this embodiment, the structures of both the switching TFT 902 and the erasing TFT 907 are formed such that the gate electrode does not overlap with the LDD region through the gate insulating film.

A p-channel TFT formed by using a well-known method is used as the current controlling TFT 904. The gate electrode 935 (935*a*, 935*b*) of the current controlling TFT is electrically connected to the drain wiring line 916 of the switching TFT 902 and the drain wiring line 926 of the erasing TFT 907 through different wiring lines.

The structure of the current controlling TFT 904 is formed such that the gate electrode does not overlap with the source region and the drain region through the gate insulating film.

Further, in this embodiment, although the current controlling TFT 904 has a single gate structure in the drawing, a multigate structure in which a plurality of TFTs are connected in series may be adopted. Further, a structure may be adopted in which a plurality of TFTs are connected in parallel with each other to substantially divide a channel formation region into plural regions so that heat radiation can be performed at high efficiency. Such a structure is effective as measures against deterioration due to heat.

A drain wiring line 936 is connected to the current supply line 906 and a constant voltage is always applied.

A first passivation film 941 is provided on the switching TFT 902, the current controlling TFT 904, and the erasing TFT 907, and an interlayer insulating film 942 made of a resin insulating film is formed thereon. It is very important to flatten stepped portions produced by the TFTs by using the interlayer insulating film 942. Since an EL layer formed later is very thin, there is a case where poor light emission occurs due to the existence of the stepped portions. Accordingly, it is desirable co make flattening before formation of a pixel electrode so that the EL layer can be formed on the flattest possible surface.

A transparent conductive film is used as a pixel electrode (anode) 943. Specifically, a conductive film made of a compound of indium oxide and zinc oxide is used. Of course, a conductive film made of a compound of indium oxide and tin oxide may be used.

Note that it is electrically connected to the drain region of the current controlling TFT 904.

An EL layer 945 is formed in a groove (corresponding to a pixel) formed by banks 944*a* and 944*b* of insulating films (preferably resin) and on the banks.

Note that although only one pixel is shown here, as descried in the mode for carrying out the invention, the EL layer 945 made of a plurality of light emitting layers is formed in the pixel portion by forming a hole injecting layer, a hole transporting layer, a plurality of light emitting layers, an electron transporting layer and an electron injecting layer.

In this embodiment, a cathode 946 is formed on the EL layer 945. Incidentally, the cathode 946 is formed of MgAg.

The EL element 909 is completed at the point when components up to the cathode 946 are formed. Note that the EL element 909 here indicates a capacitor formed of the pixel electrode (anode) 943, the EL layer 945 and the cathode 947.

Further, in this embodiment, a protective electrode 947 made of aluminum is formed on the cathode 946, and a passivation film 948 is further provided thereon. As the passivation film 948, a silicon nitride film or a silicon nitride oxide film is preferable. This object is to cut off the EL element from the outside, and has both a meaning to prevent deterioration due to oxidation of an organic EL material and a meaning to suppress degassing from the organic EL material. With this structure, the reliability of the light emitting device can be raised.

As described above, the present invention can also be used for the light emitting device having the structure as in FIGS. 9A and 9B. Incidentally, in this embodiment, although only the structure of the pixel portion has been described, the driver circuit is made to have the same structure as that shown in embodiment 1.

Note that the structure of this embodiment can be freely combined with any structure of embodiments 1 to 3 and can be carried out.

Embodiment 5

Next, FIG. 10A shows an example of a pixel structure in a pixel portion of a light emitting device in which the present invention is carried out in a structure different from embodiment 4, and FIG. 10B shows a sectional structure of the pixel portion.

Incidentally, with respect to the details of a driver method and the like, Japanese Patent Application Serial No. 2000-127384 may be consulted.

First, in FIG. 10A, reference numeral 1001 designates a source signal line connected to a source of a switching TFT 1002; and 1003, a writing gate signal line connected to a gate of the switching TFT 1002. Further, reference numeral 1004 (1004*a*, 1004*b*) designates a current controlling TFT; and 1005, a capacitor (it can also be omitted). Reference numeral 1006 designates a current supply line; and 1007, an erasing TFT which is connected to an erasing gate signal line 1008. Reference numeral 1009 designates an EL element; and 1010, a counter power supply.

A drain of the erasing TFT 1007 is connected to a gate electrode of the current controlling TFT 1004, and the gate voltage of the current controlling TFT 1004 can be forcibly changed. Although the erasing TFT 1007 may be made an n-channel TFT or a p-channel TFT, it is desirable that the erasing TFT is made to have the same structure as the switching TFT 1002 so that an off current can be made small.

Further, in this embodiment, a first current controlling TFT 1004*a* and a second current controlling TFT 1004*b* are provided in parallel with each other as the current controlling TFT 1004. With this structure, heat generated by current flowing through an active layer of the current controlling TFT can be efficiently radiated, and deterioration of the current controlling TFT can be suppressed. Further, fluctuation in drain current produced by fluctuation in characteristics, such as threshold value and mobility of the current controlling TFT, can be suppressed.

Note that in this embodiment, although the two TFTs of the first current controlling TFT 1004a and the second current controlling TFT 1004b are used as the current controlling TFT, this embodiment is not limited to this. It is sufficient if the number of TFTs used as the current controlling TFT is two or more in each pixel.

FIG. 10B is a sectional view of the light emitting device of this embodiment. Although the explanation is omitted since the device has substantially the same structure as that shown in the embodiment 3, it is characterized in that two current controlling TFTs are provided and are formed in parallel with each other as set forth in the explanation of FIG. 10A, and this will be described.

In FIG. 10B, the current controlling TFT 1004 includes the first current controlling TFT 1004a and the second current controlling TFT 1004b.

A drain 1032a of the first current controlling TFT 1004a is electrically connected to a pixel electrode 1043 of the EL element 1009 through a drain wiring line 1036a. Further, a drain 1032b of the second current controlling TFT 1004b is also electrically connected to the pixel electrode 1043 of the EL element 1009 through a drain wiring line 1036b. Both the structures of the first current controlling TFT 1004a and the second current controlling TFT 1004b are formed such that a gate electrode does not overlap with a source region and a drain region through a gate insulating film.

A gate electrode 1034 (1034a, 1034b) of the first current controlling TFT 1004a and a gate electrode 1035 (1035a, 1035b) of the second current controlling TFT 1004b are electrically connected to a drain 1012 of the switching TFT 1002 through a drain wiring line 1016. Note that they are electrically connected to a drain 1022 of the erasing TFT 1007 through a drain wiring line 1026.

In this embodiment, both structures of the switching TFT 1002 and the erasing TFT 1007 are formed such that a gate electrode does not overlap with an LDD region through a gate insulating film.

Note that in this embodiment, although only the structure of the pixel portion has been explained, a driver circuit is made to have the same structure as that shown in embodiment 1.

Further, the structure of this embodiment can be freely combined with any structure of embodiments 1 to 4 and can be carried out.

Embodiment 6

In this embodiment, a case in which light emitting layers are formed every plural pixel columns, which are different from the light emitting layers explained in the mode for carrying out the invention, will be described with reference to FIGS. 11A and 11B.

In FIG. 11A, a source side driver circuit 1102, a gate side driver circuit 1103, and a pixel portion 1104 are formed on a substrate 1101. Incidentally, in the pixel portion 1104, light emitting layers are formed every plural pixel columns, and FIG. 11B is an enlarged view of the pixel portion 1104.

In FIG. 11B, a plurality of pixels 1105 are vertically and horizontally formed side by side. The pixel 1105 is formed of a gate line (G1), a source line (S1) and a current supply line (V1) provided in the pixel portion.

In this embodiment, a pixel column including the gate lines (G1 to Gy), the source line (S1) and the current supply line (V1) is designated by m1, a pixel column including the gate lines (G1 to Gy), the source line (S2) and the current supply line (V2) is designated by m2, and a pixel column including the gate line (G1 to Gy), the source line (Sx) and the current supply line (Vx) is designated by mx.

In this embodiment, a light emitting layer a (1106a) is formed in the pixel columns m1 and m2, and after the pixel column m3 is made a preliminary region a (1107a), a light emitting layer b (1106b) is formed in the pixel columns m4 to mx-2. Further, after the pixel column mx-1 is made a preliminary region b (1107b), a light emitting layer c (1106c) is formed in the pixel column mx. Since the light emitting layers may be formed by using the same method as that shown in the mode for carrying out the invention, the explanation is omitted.

The structure of the pixel portion shown in this embodiment is different from the pixel portion shown in FIG. 1B in not only the shape of the light emitting layer but also the circuit structure. This is because it is necessary to connect the respective light emitting layers to different current supply lines, and in the pixel portion of this embodiment, the current supply lines (V1 to Vx) are formed in parallel with the source lines (S1 to Sx) and alternately.

In the case where light emitting layers having shapes different from those shown in this embodiment are formed, it is necessary to adopt such a circuit structure that different current supply lines are connected to the respective light emitting layers.

The structure of this embodiment can be freely combined with any structure of embodiments 1 to 5 and can be carried out.

Embodiment 7

When a light emitting device of the present invention is driven, analog driving using an analog signal as an image signal can be carried out, or digital driver using a digital signal can be also carried out.

In the case where the analog driving is carried out, an analog signal is transmitted to a source wiring line of a switching TFT, and an analog signal including gradation information becomes a gate voltage of a current controlling TFT. A current flowing through an EL element is controlled by the current controlling TFT, and the emission intensity of the EL element is controlled, so that a gradation display is carried out. In the case where the analog driving is carried out, it is appropriate that the current controlling TFT is operated in a saturation region.

On the other hand, in the case where the digital driving is carried out, differently from the analog gradation display, a gradation display called time division driving is carried out. That is, by adjusting the length of an emission time, color gradation is apparently visually changed. Incidentally, in the case where the digital driving is carried out, it is appropriate that the current controlling TFT is operated in a linear region.

Since the response speed of an EL element is very high as compared with a liquid crystal element, it can be driven at high speed. Thus, it may be said that the EL element is an element suitable for time division driving in which one frame is divided into a plurality of subframes and a gradation display is carried out.

Like this, since the present invention is a technique relating to an element structure, any driving method may be used.

Note that the structure of this embodiment can be freely combined with any structure of the embodiments 1 to 6 and can be carried out.

Embodiment 8

Figure 12A:
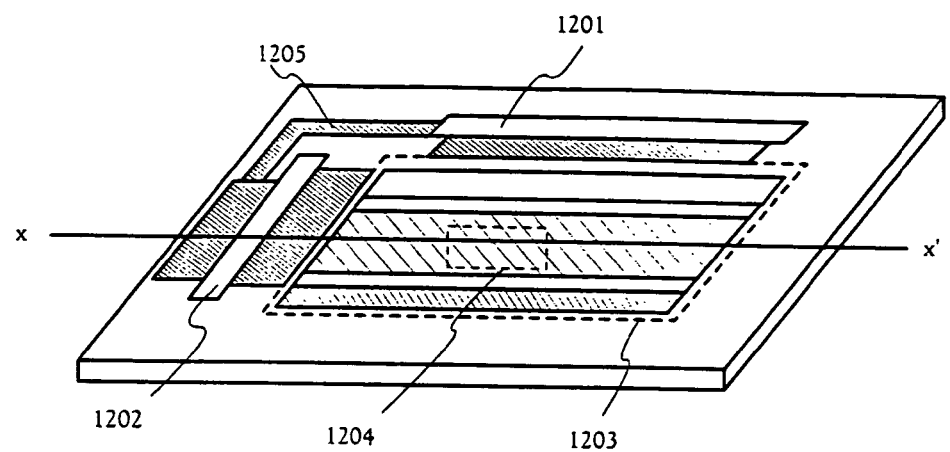
FIGS. 12A and 12B are a top view of a light emitting device and a sectional-view thereof of Embodiment 8.
Figure 12B:
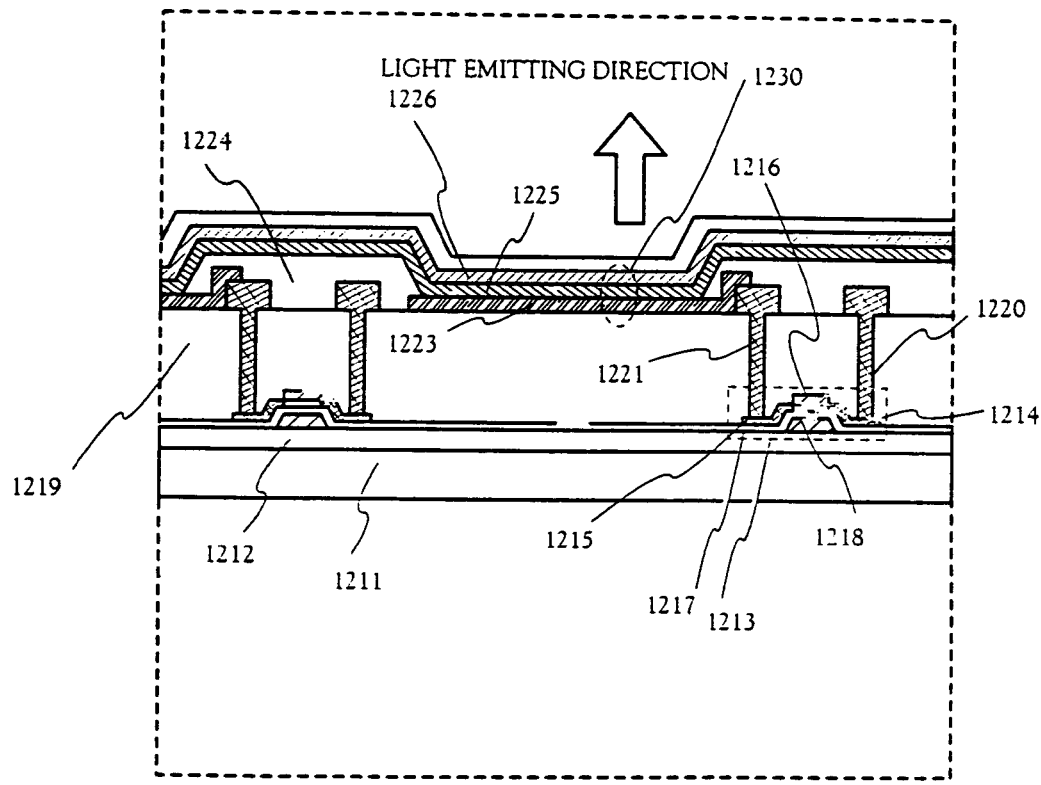

In embodiment 1, although the case of the top gate TFT is described, the present invention is not limited to the TFT structure, and as shown in FIGS. 12A and 12B, the invention may also be carried out by using a bottom gate TFT (typically an inverted stagger TFT). The inverted stagger TFT may be formed by any means.

FIG. 12A is a top view of an EL module formed in the manufacture of a light emitting device using a bottom gate TFT. A source side driver circuit 1201, a gate side driver circuit 1202, and a pixel portion 1203 are formed. Further, FIG. 12B is a sectional view of a region a 1204 of the pixel portion 1203 when the light emitting device is cut along x-x' in FIG. 12A.

In FIG. 12B, only a current controlling TFT among pixel TFTs will be described. Reference numeral 1211 designates a substrate; and 1212, an insulating film (hereinafter referred to as an under film) which becomes an under layer. A translucent substrate, typically a glass substrate, a quartz substrate, a glass ceramic substrate, or a crystallized glass substrate can be used as the substrate 1211. However, it must withstand the highest processing temperature in a manufacturing process.

Although the under film 1212 is effective especially in the case where a substrate containing movable ions or a substrate having conductivity is used, it may not be provided for a quartz substrate. As the under film 1212, an insulating film containing silicon may be used. In the present specification, the "insulating film containing silicon" indicates an insulating film containing oxygen or nitrogen at a predetermined ratio with respect to silicon, for example, a silicon oxide film, a silicon nitride film, or a silicon nitride oxide film (expressed by SiOxNy: x and y are arbitrary integers).

Reference numeral 1213 designates a current controlling TFT, which is formed of a p-channel TFT. As shown in this embodiment, in the case where the EL emission is directed toward an upper surface (surface on which a TFT and an EL layer are provided) of the substrate, it is desirable to adopt such a structure that a switching TFT is formed of an n-channel TFT and the current controlling TFT is also formed of an n-channel TFT. However, the present invention is not limited to this structure. The switching TFT and the current controlling TFT may be either of the n-channel TFT and the p-channel TFT.

The current controlling TFT 1213 is formed to include an active layer including a source region 1214, a drain region 1215 and a channel formation region 1216, a gate insulating film 1217, a gate electrode 1218, a first interlayer insulating film 1219, a source wiring line 1220, and a drain wiring line 1221. In this embodiment, the current controlling TFT 1213 is an n-channel TFT.

A drain region of the switching TFT is connected to the gate electrode 1218 of the current controlling TFT 1213. Although not shown, specifically, the gate electrode 1218 of the current controlling TFT 1213 is electrically connected to the drain region (not shown) of the switching TFT through a drain wiring line (not shown). Although the gate electrode 1218 has a single gate structure, a multigate structure may be adopted. The source wiring line 1220 of the current controlling TFT 1213 is connected to a current supply line (not shown).

The current controlling TFT 1213 is an element for controlling the amount of current injected to an EL element 1230, and a relatively large current flows. Thus, it is preferable that a channel width (W) is designed to be larger than a channel width of the switching TFT. Further, in order to prevent an excessive current from flowing to the current controlling TFT 1213, it is preferable that a channel length (L) is designed to be rather long. Desirably, it is designed so that current becomes 0.5 to 2 µA (preferably 1 to 1.5 µA) per pixel.

Further, deterioration of a TFT may be suppressed by increasing the film thickness (preferably 50 to 100 nm, more preferably 60 to 80 nm) of an active layer (especially a channel region) of the current controlling TFT 1213.

After the current controlling TFT 1213 is formed, the first interlayer insulating film 1219 and a second interlayer insulating film (not shown) are formed, and a pixel electrode 1223 electrically connected to the current controlling TFT 1213 is formed. In this embodiment, the pixel electrode 1223 made of a conductive film functions as a cathode of the EL element 1230.

Specifically, although an alloy film of aluminum and lithium is used, a conductive film made of an element in group 1 or group 2 of the periodic table or a conductive film added with those elements may be used.

After the pixel electrode 1213 is formed, a third interlayer insulating film 1224 is formed. Note that this third interlayer insulating film 1224 functions as a so-called bank.

Next, an EL layer 1225 is formed. Incidentally, FIG. 12B is a sectional view in which pixel columns having the same EL layer are arranged side by side.

In the EL layer in this embodiment, Alq3 was used for an electron injecting layer, BCP was used for an electron transporting layer, and CBP doped with Ir (ppy)3 was used for a light emitting layer. Further, a hole transporting layer was formed by using α-NPD.

Next, an anode 1226 made of a transparent conductive film is formed on the EL layer. In case of this embodiment, a conductive film made of a compound of indium oxide and tin oxide or a compound of indium oxide and zinc oxide is used as the transparent conductive film.

An EL module having an inverted stagger TFT structure can be formed by further forming a passivation film made of an insulating material on the anode. The light emitting device manufactured in this embodiment can emit light in the direction of an arrow (upper surface) of FIG. 12B.

Since the inverted stagger TFT has a structure in which the number of process steps is easily made smaller than that of a top gate type TFT, it is very effective in the reduction of manufacturing costs as the object of the present invention.

Incidentally, the structure of this embodiment can be freely combined with any structure of embodiments 1 to 7 and can be carried out.

Embodiment 9

The light-emitting display device of the present invention, is a self light-emitting type, therefore compared to a liquid crystal display device, it has excellent visible properties and is broad in an angle of visibility. Accordingly, the light-emitting display device can be applied to a display portion in various electronic apparatuses.

As electronic apparatuses of the present invention there are: a navigation system; a sound reproduction device (a car audio stereo and an audio set and so forth); a game apparatus; a portable information terminal (such as a mobile computer, a portable telephone, a portable game machine, or an electronic book); and an image playback device equipped with a recording medium. Specifically, device provided with a display portion which plays back images in a recording medium, and displays the images. Specific examples of those electronic equipments are shown in FIGS. 13A to 14F.

Figure 13A:
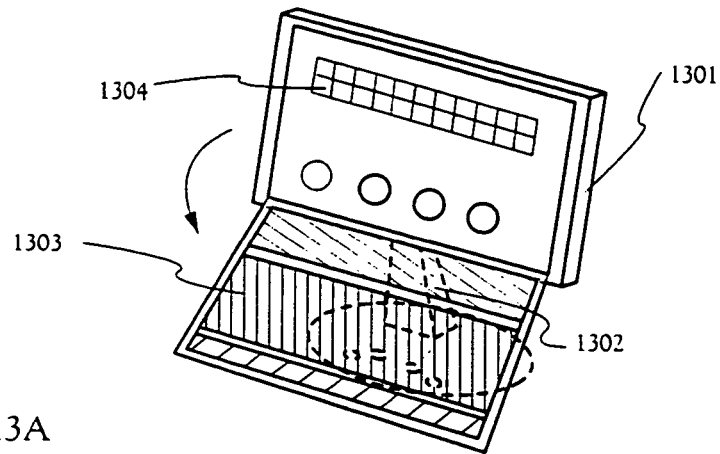
FIGS. 13A to 13C are views showing specific examples of electronic apparatuses using light emitting devices of Embodiment 9.

FIG. 13A shows a display device containing a casing 1301, a support stand 1302, and a display portion 1303. The display portion 1303 is stored, and appears at the operation time by opening it in the direction of the arrow. Though the operation button 1304 is covered at the unoperation time by the display portion 1303, it appears at the same time as opening the display portion 1303.

The light-emitting device of the present invention can be used as the display portion 1303. Such a light-emitting device is a self light-emitting type so that a back light is not necessary. Thus, the display portion can be made thinner than that of a liquid crystal display.

Figure 13B:
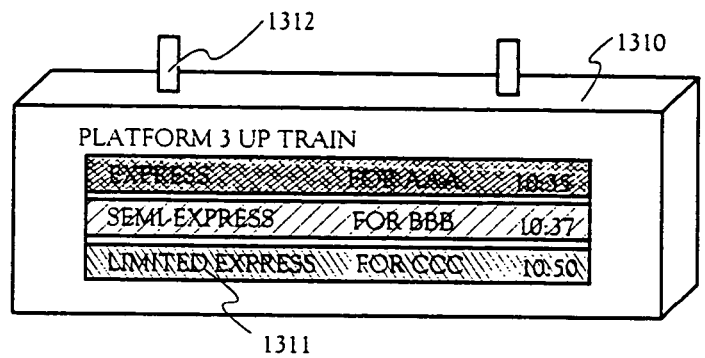

FIG. 13B is a destination signboard of the train and the bus equipped with a main body 1310, a display portion 1311 and a mounting portion 1312. The light-emitting device can be used as the display portion 1311. According to this, the kinds of route and destination of the train can be displayed divisionally.

Figure 13C:
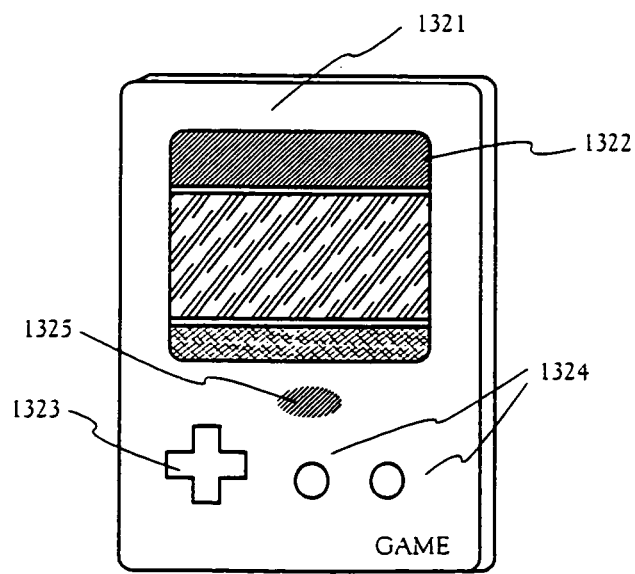

FIG. 13C is a game machine equipped with a main body 1321, a display portion 1322, an operation button (a) 1323, an operation button (b) 1324 and a speaker portion 1325. The light-emitting device of the present invention can be used as the display portion 1322.

Further, the above electronic devices display often information transmitted through an electronic communication circuit, and particularly situations of displaying moving images is increasing. The response speed of EL materials is so high that the light-emitting device of the present invention are good for display of moving image.

Figure 14A:
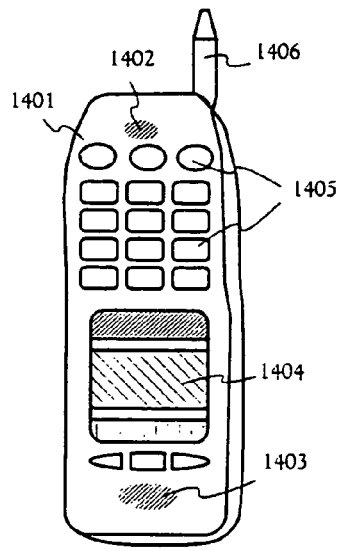
FIGS. 14A to 14F are views showing specific examples of electronic apparatuses using light emitting devices of Embodiment 9.

FIG. 14A shows a portable telephone, and contains a main body 1401, a sound output portion 1402, a sound input portion 1403, a display portion 1404, operation switches 1405, and an antenna 1406. The light-emitting device of the present invention can be used as the display portion 1404. Note that by displaying white color characters in a black color background, the display portion 1404 can suppress the power consumption of the portable telephone.

Figure 14B:
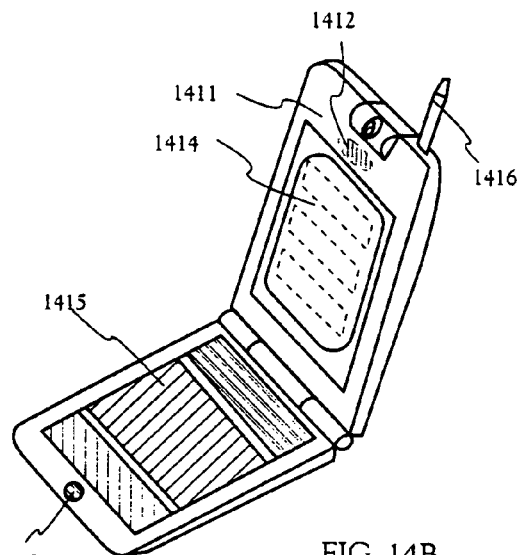
Figure 14C:
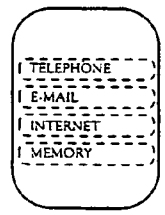
Figure 14D:
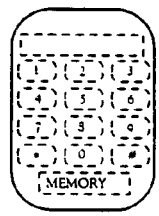
Figure 14E:
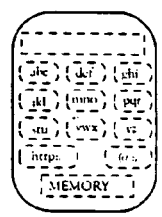

FIG. 14B shows also a portable telephone, but it is a folding twice type different from that of FIG. 14A, and contains a main body 1411, a sound output portion 1412, a sound input portion 1413, a display portion (a) 1414, a display portion (b) 1415 and an antenna 1416. The operation switch is not adhered to the portable telephone, but its function is provided to the portable telephone by displaying a character information shown in FIGS. 14C, 14D and 14E by either of a character portion (a) or (b). Further, another display portion displays mainly the image information. The light-emitting device of the present invention can be used as the display portion (a) 1414 or a display portion (b) 1415.

Figure 14F:
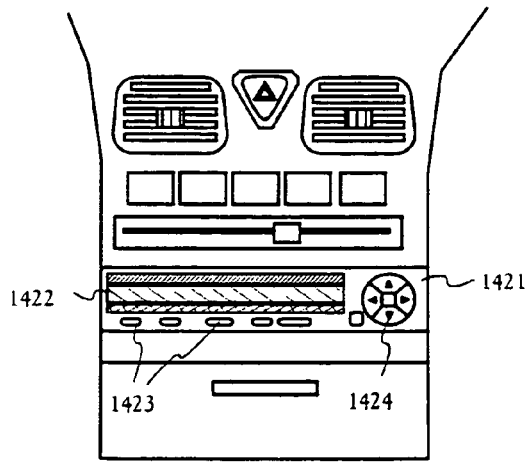

FIG. 14F shows a sound reproduction device, in a concrete term, a car audio stereo, and contains a main body 1421, a display portion 1422, and operation switches 1423 and 1424. The light-emitting device of the present invention can be used as the display portion 1422. Further, a car mounting audio stereo is shown in this embodiment, but a portable type or a domestic type sound reproduction device may also be used. Note that, the display portion 1422 can suppress the power consumption by displaying white color character in a black color background, particularly in the portable sound reproduction device. Particularly it have an effect on the portable sound reproduction device.

In the case of the portable electronic device shown in this embodiment, the sensor portion is provided as a method of lowering the power consumption, which perceives the external light and functions to lower the brightness of display when it is used in the dark.

As described above, the application range of this invention is extremely wide, and it may be used for electronic apparatuses in various fields. Further, the electronic apparatuses of this embodiment may be obtained by freely combining any of the structures shown in Embodiments 1 to 8.

Embodiment 10

Figure 15:
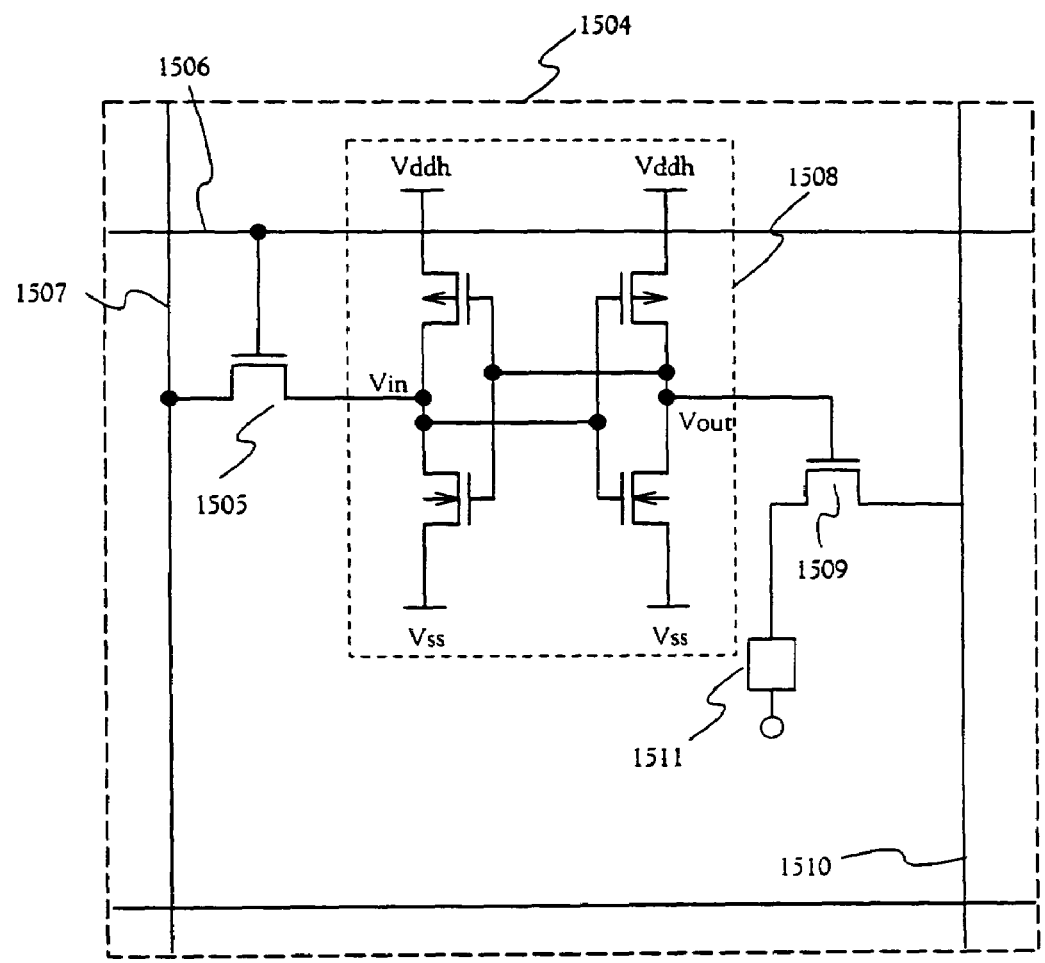
FIG. 15 is a view showing a pixel portion of a light emitting device of Embodiment 10.

Next, in this embodiment, a description will be given of a case where an SRAM is introduced in a pixel portion. FIG. 15 is an enlarged view of a pixel 1504.

In FIG. 15, reference numeral 1505 designates a switching TFT. A gate electrode of the switching TFT 1505 is connected to a gate signal line 1506 as one of gate signal lines (G1 to Gn) to which gate signals are inputted. One of a source region and a drain region of the switching TFT 1505 is connected to a source signal line 1507 as one of source signal lines (S1 to Sn) to which signals are inputted, and the other is connected to an input side of an SRAM 1508. An output side of the SRAM 1508 is connected to a gate electrode of a current controlling TFT 1509.

One of a source region and a drain region of the current controlling TFT 1509 is connected to a current supply line 1510 as one of current supply lines (V1 to Vn), and the other is connected to an EL element 1511.

The EL element 1511 includes an anode, a cathode, and an EL layer provided between the anode and the cathode. In the case where the anode is connected to the source region or the drain region of the current controlling TFT 1509, in other words, in the case where the anode is a pixel electrode, the cathode becomes a counter electrode. On the contrary, in the case where the cathode is connected to the source region or the drain region of the current controlling TFT 1509, in other words, in the case where the cathode is the pixel electrode, the anode becomes a counter electrode.

The SRAM 1508 includes two p-channel TFTs and two n-channel TFTs, source regions of the p-channel TFTs are connected to Vddh at a high voltage side, and source regions of the n-channel TFTs are connected to Vss at a low voltage side. One p-channel TFT and one n-channel TFT makes a pair, and two pairs of the p-channel TFTs and the n-channel TFTs exist in one SRAM.

Drain regions of the pair of the p-channel TFT and the n-channel TFT are connected to each other. Further, gate electrodes of the pair of the p-channel TFT and the n-channel TFT are connected to each other. The drain regions of one of the pairs of the p-channel TFTs and the n-channel TFTs are kept to have the same potential as the gate electrodes of the other of the pairs of the p-channel TFTs and the n-channel TFTs.

The drain regions of one of the pairs of the p-channel TFTs and the n-channel TFTs are an input side where an input signal (Vin) is inputted, and the drain regions of the other of the pairs of the p-channel TFTs and the n-channel TFTs are an output side where an output signal (Vout) is outputted.

The SRAM is designed such that Vin is held and Vout of an inverted signal of Vin is outputted. That is, when Vin is Hi, Vout becomes a Lo signal equivalent to Vss, and when Vin is Lo, Vout becomes a Hi signal equivalent to Vddh.

Note that as described in this embodiment, in the case where one SRAM is provided in the pixel 1504, since memory data in the pixel is held, it is possible to display a still picture in the state where most of the external circuits are stopped. With this structure, reduction in consumed electric power can be realized.

It is also possible to provide a plurality of SRAMs in a pixel, and in the case where the plurality of SRAMs are provided, a plurality of data can be held, so that a gradation display by time gradation becomes possible.

Incidentally, the structure of this embodiment can be freely combined with any structure of embodiments 1 to 9 and can be carried out.

By carrying out the present invention, an active matrix type light emitting device with high definition can be easily made multicolored. Further, reduction in electric power can be realized by using a light emitting layer made of a triplet compound in a plurality of light emitting layers.

What is claimed is:

1. A light emitting device comprising:
   a pixel portion in which a plurality of pixels are arranged in matrix on an insulating surface;
   at least first and second light emitting layers in the pixel portion; and
   a region between the first and the second light emitting layers,
   wherein each of the plurality of pixels except for pixels in the region includes the first light emitting layer or the second light emitting layer and each of the plurality of pixels comprises:
   a thin film transistor including a gate electrode, a gate insulating film, an active layer and a wiring; and
   a bank over the thin film transistor,
   wherein the first light emitting layer or the second light emitting layer is formed over the bank,
   wherein the region includes a row of pixels and the region has no light emitting layer, and
   wherein the first light emitting layer is formed in a plurality of pixel rows and the second light emitting layer is formed in a plurality of pixel rows.

2. A device according to claim 1, further comprising:
   a current control thin film transistor; and
   a current supply line connected to the current control thin film transistor, wherein the current supply line is formed in parallel with a direction in which the plurality of pixel rows are formed.

3. A device according to claim 1, wherein two to six kinds of light emitting layers are included in the pixel portion.

4. A device according to claim 1, wherein at least one light emitting layer comprises a third transition series element.

5. A device according to claim 1, wherein an EL element in the region does not emit light.

6. A device according to claim 1, wherein the device includes from one to five of the regions.

7. A device according to claim 1, wherein the device has a driving voltage in a range of 1.2V to 10V.

8. A device according to claim 1, wherein a display method of a character display and a background display is inverted when a driving time is changed to a standby time.

9. A device according to claim 1, wherein the light emitting device is one selected from the group consisting of a display device, a destination signboard, a game machine, a portable telephone, and a sound reproduction device.

10. A portable telephone comprising:
    a body; and
    a display portion attached to the body;
    wherein the display portion comprises:
    a pixel portion in which a plurality of pixels are arranged in matrix on an insulating surface;
    a plurality of light emitting layers in the pixel portion;
    a plurality of EL elements sharing one of the plurality of light emitting layers in the pixel portion; and
    a region between two light emitting layers,
    wherein each of the plurality of pixels includes a thin film transistor, and
    wherein the region includes the thin film transistor of a pixel and the region has no light emitting layer.

11. A portable telephone according to claim 10, wherein the plurality of light emitting layers are formed in a plurality of pixel rows.

12. A portable telephone according to claim 11, further comprising:
    a current control thin film transistor; and
    a current supply line connected to the current control thin film transistor,
    wherein the current supply line is formed in parallel with a direction in which the plurality of pixel rows are formed.

13. A portable telephone according to claim 10, wherein the plurality of light emitting layers are formed in a plurality of pixel columns.

14. A portable telephone according to claim 13, further comprising:
    a current control thin film transistor; and
    a current supply line connected to the current control thin film transistor,
    wherein the current supply line is formed in parallel with a direction in which the plurality of pixel columns are formed.

15. A portable telephone according to claim 10, wherein the plurality of light emitting layers includes two to six kinds of light emitting layers.

16. A portable telephone according to claim 10, wherein at least one light emitting layer comprises a third transition series element.

17. A portable telephone according to claim 10, wherein an EL element in the region does not emit light.

18. A portable telephone according to claim 10, wherein the device includes from one to five of the regions.

19. A portable telephone according to claim 10, wherein the device has a driving voltage in a range of 1.2V to 10V.

20. A portable telephone according to claim 10, wherein a display method of a character display and a background display is inverted when a driving time is changed to a standby time.

21. A light emitting device comprising:
    a pixel portion in which a plurality of pixels are arranged in a matrix on an insulating surface;
    at least first and second light emitting layers in the pixel portion; and
    a region between the first and the second light emitting layers,
    wherein each of the plurality of pixels except for pixels in the region includes the first light emitting layer or the second light emitting layer and each of the plurality of pixels comprises:
    a thin film transistor including a gate electrode, a gate insulating film, an active layer and a wiring; and
    a bank over the thin film transistor,
    wherein the first light emitting layer or the second light emitting layer is formed over the bank,
    wherein the region includes a column of pixels and the region has no light emitting layer, and
    wherein the first light emitting layer is formed in a plurality of pixel columns and the second light emitting layer is formed in a plurality of pixel columns.

22. A device according to claim 21, further comprising:
    a current control thin film transistor; and a current supply line connected to the current control thin film transistor,
wherein the current supply line is formed in parallel with a direction in which the plurality of pixel columns are formed.

23. A device according to claim 21, wherein two to six kinds of light emitting layers are included in the pixel portion.

24. A device according to claim 21, wherein at least one light emitting layer comprises a third transition series element.

25. A device according to claim 21, wherein an EL element in the region does not emit light.

26. A device according to claim 21, wherein the device includes from one to five of the regions.

27. A device according to claim 21, wherein the device has a driving voltage in a range of 1.2V to 10V.

28. A device according to claim 21, wherein a display method of a character display and a background display is inverted when a driving time is changed to a standby time.

29. A device according to claim 21, wherein the light emitting device is one selected from the group consisting of a display device, a destination signboard, a game machine, a portable telephone, and a sound reproduction device.

30. A light emitting device comprising:
a pixel portion in which a plurality of pixels are arranged in a matrix on an insulating surface;
at least first and second light emitting layers in the pixel portion; and
a region between the first and the second light emitting layers,
wherein each of the plurality of pixels except for pixels in the region includes the first light emitting layer or the second light emitting layer and each of the plurality of pixels comprises:
a thin film transistor including a gate electrode, a gate insulating film, an active layer and a wiring; and
a bank over the thin film transistor,
wherein the first light emitting layer or the second light emitting layer is formed over the bank,
wherein the region includes the thin film transistor of a pixel and the region has no light emitting layer, and
wherein a plurality of EL elements are sharing the first light emitting layer or the second light emitting layer in the pixel portion.

31. A device according to claim 30, wherein each of the first light emitting layer and the second light emitting layer is formed in a plurality of pixel rows.

32. A device according to claim 31, further comprising:
a current control thin film transistor; and
a current supply line connected to the current control thin film transistor, wherein the current supply line is formed in parallel with a direction in which the plurality of pixel rows are formed.

33. A device according to claim 30, wherein each of the first light emitting layer and the second light emitting layer is formed in a plurality of pixel columns.

34. A device according to claim 33, further comprising:
a current control thin film transistor; and
a current supply line connected to the current control thin film transistor,
wherein the current supply line is formed in parallel with a direction in which the plurality of pixel columns are formed.

35. A device according to claim 30, wherein two to six kinds of light emitting layers are included in the pixel portion.

36. A device according to claim 30, wherein at least one light emitting layer comprises a third transition series element.

37. A device according to claim 30, wherein an EL element in the region does not emit light.

38. A device according to claim 30, wherein the device includes from one to five of the regions.

39. A device according to claim 30, wherein the device has a driving voltage in a range of 1.2V to 10V.

40. A device according to claim 30, wherein a display method of a character display and a background display is inverted when a driving time is changed to a standby time.

41. A device according to claim 30, wherein the light emitting device is one selected from the group consisting of a display device, a destination signboard, a game machine, a portable telephone, and a sound reproduction device.

* * * * *